(12) United States Patent
Lu

(10) Patent No.: US 8,458,642 B2
(45) Date of Patent: Jun. 4, 2013

(54) METHOD, A PROGRAM STORAGE DEVICE AND A COMPUTER SYSTEM FOR MODELING THE TOTAL CONTACT RESISTANCE OF A SEMICONDUCTOR DEVICE HAVING A MULTI-FINGER GATE STRUCTURE

(75) Inventor: Ning Lu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 193 days.

(21) Appl. No.: 13/072,859

(22) Filed: Mar. 28, 2011

(65) Prior Publication Data
US 2012/0254820 A1 Oct. 4, 2012

(51) Int. Cl.
*G06F 17/50* (2006.01)
(52) U.S. Cl.
USPC ............................ 716/136; 716/100; 716/106
(58) Field of Classification Search
USPC .......................................... 716/100, 106, 136
See application file for complete search history.

(56) References Cited

U.S. PATENT DOCUMENTS

| | | | | |
|---|---|---|---|---|
| 4,571,815 A * | 2/1986 | Baliga et al. | ................... | 438/137 |
| 5,554,561 A * | 9/1996 | Plumton | ....................... | 438/193 |
| 5,828,102 A | 10/1998 | Bergemont | | |
| 5,965,912 A | 10/1999 | Stolfa et al. | | |
| 6,519,752 B1 | 2/2003 | Bakker et al. | | |
| 6,794,707 B1 | 9/2004 | Cao | | |
| 6,845,347 B1 | 1/2005 | Yang et al. | | |
| 6,927,458 B2 * | 8/2005 | Worley | .......................... | 257/361 |
| 7,098,510 B2 * | 8/2006 | Kodama et al. | ................ | 257/355 |
| 7,139,990 B2 | 11/2006 | Singh et al. | | |
| 7,353,473 B2 | 4/2008 | Pino et al. | | |
| 7,646,063 B1 * | 1/2010 | Boyd et al. | ..................... | 257/355 |
| 7,655,944 B1 | 2/2010 | Darwish | | |
| 2006/0006431 A1 | 1/2006 | Jean et al. | | |
| 2006/0107246 A1 | 5/2006 | Nakamura | | |
| 2008/0174357 A1 | 7/2008 | Matsuda | | |
| 2010/0078724 A1 * | 4/2010 | Imoto et al. | ................... | 257/355 |

FOREIGN PATENT DOCUMENTS

JP 2003197494 7/2003

OTHER PUBLICATIONS

Wong et al., "Scalable Modeling of MOSFET Source and Drain Resistances for MS/RF Circuit Simulation," IEEE, 8th International Conference on Solid-State and Integrated Circuit Technology, Oct. 2006, Shanghai, China, 5 pages.
Lu et al., "Characterization, Simulation, and Modeling of FET Source/Drain Diffusion Resistance," IEEE 2008, Custom Intergrated Circuits Conference (CiCC), Proc. CiCC, pp. 281-284.

* cited by examiner

*Primary Examiner* — Sun Lin
(74) *Attorney, Agent, or Firm* — Gibb & Riley, LLC; Anthony J. Canale

(57) ABSTRACT

Disclosed are embodiments for modeling contact resistance of devices, such as metal oxide semiconductor field effect transistors or varactors, that specifically have a multi-finger gate structure. In the embodiments, a set of expressions for total contact resistance are presented, in which (i) the total contact resistance is the sum of the resistance contribution from the contact (or the set of all contacts) in each diffusion region, (ii) the resistance contribution from the contact (or the set of all contacts) to the total contact resistance is the product of its resistance and the square of the relative electric current passing through it, and (iii) the electric current passing through the contact (or the set of all contacts) in a shared diffusion region (i.e., in an inner diffusion region) is twice of the electric current passing through the contact (or the set of all contacts) in an unshared diffusion region (i.e., in an outer diffusion region).

21 Claims, 14 Drawing Sheets

US 8,458,642 B2

METHOD, A PROGRAM STORAGE DEVICE AND A COMPUTER SYSTEM FOR MODELING THE TOTAL CONTACT RESISTANCE OF A SEMICONDUCTOR DEVICE HAVING A MULTI-FINGER GATE STRUCTURE

BACKGROUND

1. Field of the Invention

The embodiments disclosed herein relate to contact resistance modeling and, more particularly, to a method, a program storage device and a computer system for modeling the total contact resistance of a semiconductor device, such as a metal oxide semiconductor field effect transistor (MOSFET) or metal oxide semiconductor variable capacitor (MOS varactor), that specifically has a multi-finger gate structure.

2. Description of the Related Art

Parasitic contact resistance is one of the largest parasitic resistances that impact semiconductor device performance. Thus, during semiconductor device design, accurate modeling of the total contact resistance is very important. However, the current techniques used to model the total contact resistance of semiconductor devices, such as metal oxide semiconductor field effect transistors (MOSFETs) or metal oxide semiconductor variable capacitors (MOS varactors), that specifically have a multi-finger gate structure may result in a relatively large error. Therefore, there is a need in the art for technique that can be used to more accurately model the total contact resistance of such devices.

SUMMARY

Disclosed herein are method embodiments for modeling contact resistance of semiconductor devices, such as metal oxide semiconductor field effect transistors (MOSFETs) or metal oxide semiconductor variable capacitors (MOS varactors), that specifically have a multi-finger gate structure. In the method embodiments a set of accurate expressions for total contact resistance are presented, in which (i) the total contact resistance is the sum of the resistance contribution from the contact (or, if applicable, the set of all contacts) in each diffusion region, (ii) the resistance contribution from the contact (or, if applicable, the set of all contacts) on each diffusion region to the total contact resistance is the product of its resistance and the square of the relative electric current passing through it, and (iii) the electric current passing through the contact (or, if applicable, the set of all contacts) in a shared diffusion region (i.e., in an inner diffusion region) is twice of the electric current passing through the contact (or, if applicable, the set of all contacts) in an unshared diffusion region (i.e., in an outer diffusion region). It should be noted that, for MOSFETs, total source contact resistance and total drain contact resistance are computed separately. Also disclosed herein are associated program storage device and computer system embodiments.

More particularly, disclosed herein is an embodiment of a method of modeling contact resistance for a MOSFET, having a multi-finger gate structure, as well as embodiments of an associated program storage device and an associated computer system. Specifically, the MOSFET can comprise a semiconductor body. The semiconductor body can comprise multiple diffusion regions (including both source regions and drain regions) and multiple channel regions with each channel region being positioned between a source region and a drain region. The MOSFET can further comprise a gate structure having multiple fingers with each finger traversing the semiconductor body adjacent to a corresponding channel region and between the source region and the drain region. Finally, the MOSFET can comprise multiple contacts to the multiple diffusion regions.

In these embodiments, a design for a MOSFET, such as that described above, can be received (e.g., by the computer system via an input device). Next, the design can be analyzed (e.g., by a processor in the computer system) to determine if the MOSFET is of a type having a multi-finger gate structure and, if so, to determine the number of fingers in the gate structure. Once the number of fingers is determined, both a first total contact resistance associated with the source regions and a second total contact resistance associated with the drain regions can be calculated based on the number of fingers. To do this, formulas can be used (e.g., by the processor) and these formulas can specifically account for the fact that a first amount of current passing through the contact (or, as discussed in greater detail below, the set of all contacts) to an inner diffusion region between two fingers of the gate structure will be greater than and, particularly, double a second amount of current passing through the contact (or, the set of all contacts) to an outer diffusion region adjacent to only one finger of the gate structure and, thus, the contribution to the total contact resistance from the contact (or, as discussed in greater detail below, the set of all contacts) in an inner diffusion region is four times of the contribution to the total contact resistance from the contact (or, as discussed in greater detail below, the set of all contacts) in an outer diffusion region (when the contact resistance in the inner diffusion region equals the contact resistance in the outer diffusion region).

For example, to calculate the first total contact resistance associated with contacts to source regions only, the following first formula can be used:

$$R_{tsc} = R_{sc} \frac{N_{os} + 2^2 N_{is}}{n_f^2}, \quad (1)$$

where $R_{tsc}$ is the total resistance of all contacts to all of the source regions, $R_{sc}$ is the resistance of all contacts to one of the source regions (assuming that this resistance value is the same for all source regions), $N_{os}$ is the total number of outer source regions, $N_{is}$ is the total number of inner source regions, and $n_f$ is the number of the gate fingers. It should, however, be noted that if the same number $n_{sc}$ of multiple contacts land on each of the source regions, then in this first formula $R_{sc}$ will be equal to $R_{sc1}/n_{sc}$, where $R_{sc1}$ is the resistance of a single one of the contacts to a single one of the source regions (assuming that this resistance value is the same for all contacts to the same source region).

Similarly, to calculate the second total contact resistance associated with contacts to drain regions only, the following second formula can be used:

$$R_{tdc} = R_{dc} \frac{N_{od} + 2^2 N_{id}}{n_f^2}, \quad (2)$$

where $R_{tdc}$ is the total resistance of all contacts to all of the drain regions, $R_{dc}$ is the resistance of all contacts to one of the drain regions (assuming that this resistance value is the same for all drain regions), $N_{od}$ is the total number of outer drain regions, $N_{id}$ is the total number of inner drain regions, and $n_f$ is the number of the gate fingers. It should, however, be noted that if the same number $n_{dc}$ of multiple contacts lands on each of the drain regions, then in this second formula $R_{dc}$ will be equal to $R_{dc1}/n_{dc}$ where $R_{dc1}$ is the resistance of a single one of the contacts to a single one of the drain regions (assuming that this resistance value is the same for all contacts to the same drain region).

Also disclosed herein is an embodiment of a method of modeling contact resistance for a MOS varactor, having a multi-finger gate structure, as well as embodiments of an associated program storage device and an associated computer system. Specifically, MOS varactor can comprise a semiconductor body comprising multiple diffusion regions and multiple channel regions with each channel region being positioned between two of the diffusion regions. The MOS varactor can further comprise a gate structure having multiple fingers with each finger traversing the semiconductor body adjacent to a corresponding channel region and between the two of the diffusion regions. Finally, the MOS varactor can comprise multiple contacts to the multiple diffusion regions.

In these embodiments, a design for a MOS varactor, such as that described above, can be received (e.g., by a computer system via an input device). Next, the design can be analyzed (e.g., by a processor in the computer system) to determine if the MOS varactor is of a type having a multi-finger gate structure and, if so, to determine the number of fingers in the gate structure. Once the number of fingers is determined, the total contact resistance associated with the diffusion regions can be calculated based on the number of fingers. To do this, a formula can be used (e.g., by the processor) and this formula can specifically account for the fact that a first amount of current passing through a contact (or, as discussed in greater detail below, a set of all contacts) to an inner diffusion region between two fingers of the gate structure will be greater than and, particularly, double a second amount of current passing through the contact (or, the set of all contacts) to an outer diffusion region adjacent to only one finger of the gate structure and, thus, the contribution to the total contact resistance from the contact (or, as discussed in greater detail below, the set of all contacts) in an inner diffusion region is four times of the contribution to the total contact resistance from the contact (or, as discussed in greater detail below, the set of all contacts) in an outer diffusion region (when the contact resistance in the inner diffusion region equals the contact resistance in the outer diffusion region).

For example, to calculate the total contact resistance associated with contacts to the diffusion regions of the MOS varactor, the following formula can be used:

$$R_{tc} = R_c \frac{(N_{od}/2^2) + N_{id}}{n_f^2}, \quad (3)$$

where $R_{tc}$ is the total resistance of all contacts to all of the diffusion regions, $R_c$ is the resistance of all contacts to one of the diffusion regions (assuming that this resistance value is the same for all diffusion regions), $N_{od}$ is the total number of outer diffusion regions, $N_{id}$ is the total number of inner diffusion regions, and $n_f$ is the number of the gate fingers. It should, however, be noted that if the same number $n_c$ of contacts lands on each of the diffusion regions, then in this formula $R_c$ will be equal to $R_{c1}/n_c$, where $R_{c1}$ is the resistance of a single one of the contacts to the one of the diffusion regions (assuming that this resistance value is the same for all contacts to the same diffusion region).

BRIEF DESCRIPTION OF THE SEVERAL VIEWS OF THE DRAWINGS

The embodiments disclosed herein will be better understood from the following detailed description with reference to the drawings, which are not necessarily drawn to scale and in which.

DETAILED DESCRIPTION

The embodiments disclosed herein and the various features and advantageous details thereof are explained more fully in the detailed description below with reference to the accompanying drawings.

As mentioned above, parasitic contact resistance is one of the largest parasitic resistances that impact semiconductor device performance. Thus, during semiconductor device design, accurate modeling of total contact resistance is very important. However, the current techniques used to model the total contact resistance of semiconductor devices that specifically have a multi-finger gate structure may result in a relatively large error.

Figure 1:
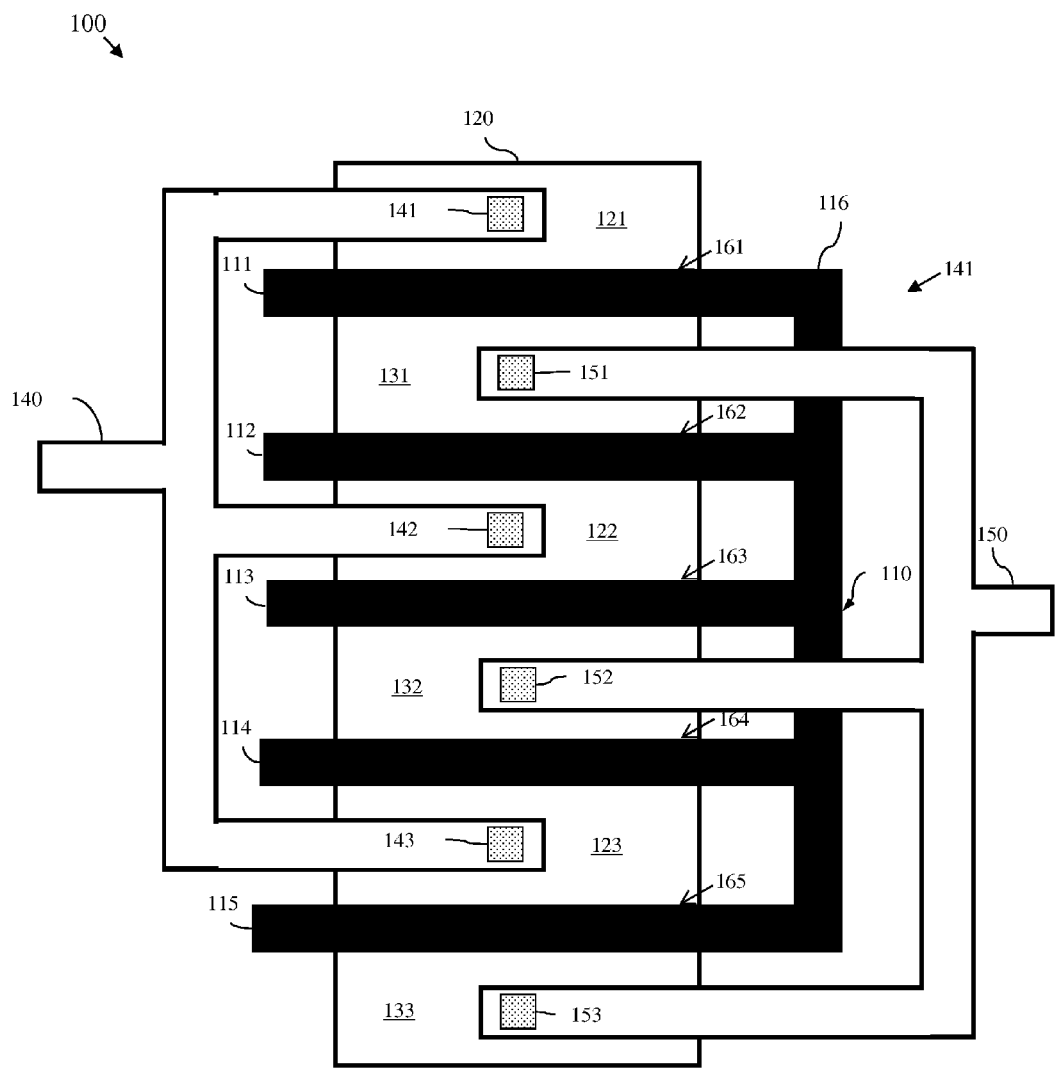
FIG. 1 is a schematic drawing illustrating an exemplary metal oxide semiconductor field effect transistor (MOSFET) having a multi-finger gate structure.
Figure 2:
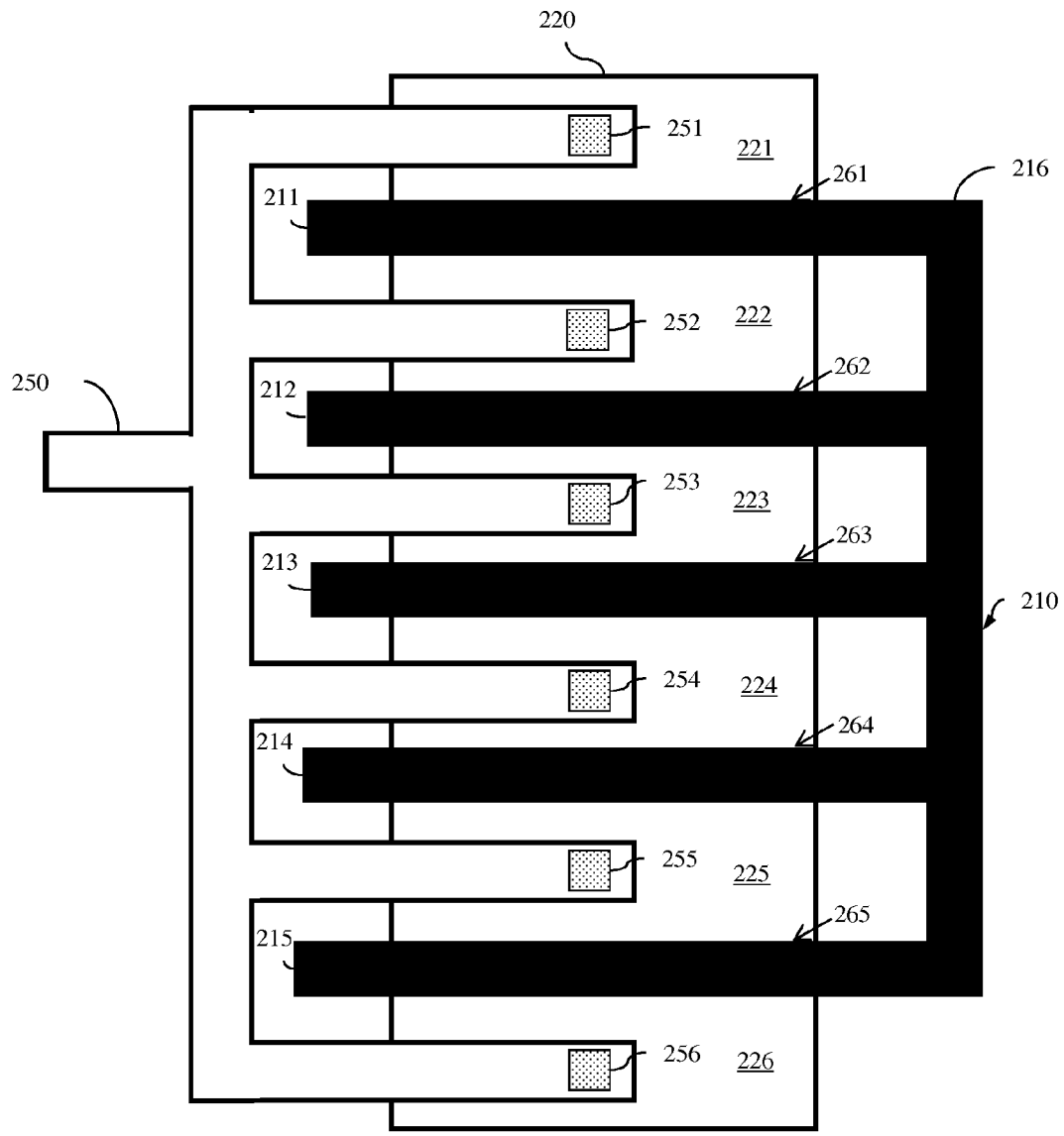
FIG. 2 is a schematic drawing illustrating an exemplary metal oxide semiconductor variable capacitor (MOS varactor) having a multi-finger gate structure.

Specifically, FIG. 1 illustrates an exemplary metal oxide semiconductor field effect transistor (MOSFET) device 100 having a multi-finger gate structure 110 and FIG. 2 illustrates an exemplary metal oxide semiconductor variable capacitor (MOS varactor) 200 similarly having a multi-finger gate structure 210.

As shown in FIG. 1, a MOSFET device 100 can comprise a single gate structure 110 comprising a main body 116 and multiple essentially parallel fingers 111-115 (also referred to as segments or extensions) extending laterally from one side of the main body 116 across a semiconductor body 120. Each finger 111-115 can be positioned adjacent to (i.e., on, above, etc.) a corresponding channel region 161-165, which is between a source region 121-123 and a drain region 131-133 within the semiconductor body 120. For example, as illustrated in FIG. 1, gate finger 111 is positioned adjacent to channel region 161 between source region 121 and drain region 131; gate finger 112 is positioned adjacent to channel region 162 between drain region 131 and source region 122; and so on. Furthermore, the layout of source and drain regions within the semiconductor body 120 can be such that a shared source region or a shared drain region is located between adjacent gate fingers. For example, a shared drain region 131 with shared drain contact(s) 151 is located between gate fingers 111 and 112; a shared source region 122 with shared source contact(s) 142 is located between gate fingers 112 and 113; and so on. Finally, all source contacts 141-143 can be wired to the same node 140 and all drain contacts 151-153 can be wired to the same node 150. Such a MOSFET device 100 can be used to achieve optimum gain and noise performance for mixed-signal and radio frequency (RF) designs.

As shown in FIG. 2, a MOS varactor 200 can comprise a single gate structure 210 comprising a main body 216 and multiple essentially parallel fingers 211-215 (also referred to as segments or extensions) extending laterally from one side of the main body 216 across a semiconductor body 220. Each finger 211-215 can be positioned adjacent to (i.e., on, above, etc.) a channel region 261-265 and between diffusion regions (e.g., N+ diffusion regions or P+ diffusion regions) within a well region (e.g., an N-well region or a P-well region) within the semiconductor body 220. For example, as illustrated in FIG. 2, gate finger 211 is positioned adjacent to channel region 261 between diffusion regions 221 and 222; gate finger 212 is positioned adjacent to channel region 262 between diffusion regions 222 and 223; and so on. Furthermore, the layout of the diffusion regions within the semiconductor body 220 can be such that a shared diffusion region with one or more shared contacts is located between adjacent gate fingers. For example, as illustrated in FIG. 2, a shared diffusion region 222 with shared contact(s) 252 is located between gate fingers 211 and 212; a shared diffusion region 223 with shared contact(s) 253 is located between gate fingers 212 and 213; and so on. Finally, all of the diffusion region contacts 251-256 can be wired to the same node 250. The capacitance of such a MOS varactor 200 can be widely varied by applying varying voltages to the gate structure 210.

The current techniques used to model the contact resistance of semiconductor devices having multi-finger gate structures typically treat all contacts as having the same resistance values.

Figure 4:
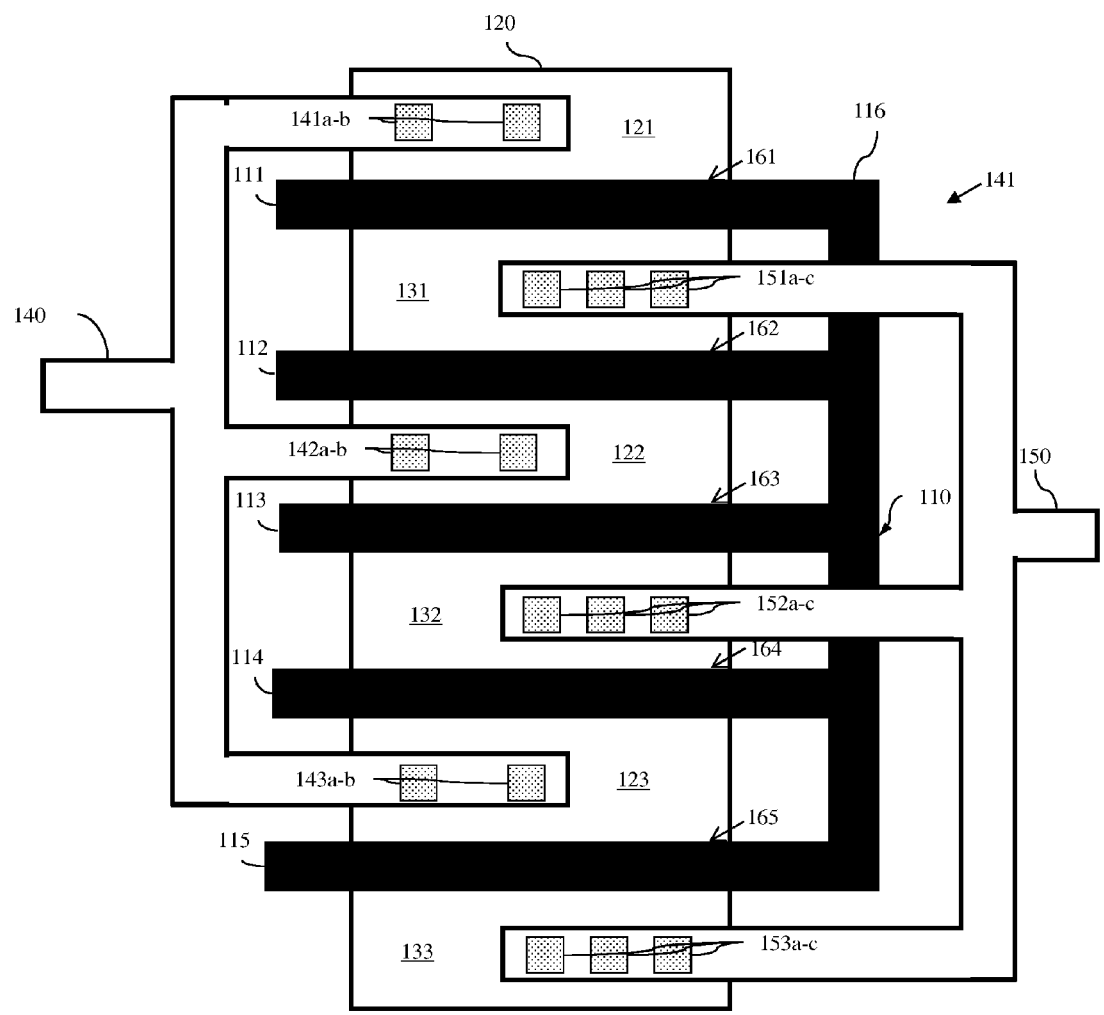
FIG. 4 is a schematic drawing illustrating an alternative MOSFET having a multi-finger gate structure.

For example, for a MOSFET having a multi-finger gate structure, such as the MOSFET 100 described above and illustrated in FIG. 1, the total source contact resistance is typically modeled based on the assumption that the source contacts 141-143 are connected in parallel themselves (one end to the node 140). Typically, each contact has the same resistance value $R_{sc1}$. Consequently, the prior-art formula applied to determine the total source contact resistance ($R_{tsc}$) is as follows:

$$R_{tsc} = R_{sc1}/(N_s n_{sc}), \qquad \text{(prior art)(4)}$$

where $R_{sc1}$ is the resistance of any one of the contacts landing on a given source region, $N_s$ is the total number of source regions (including both shared and unshared), and $n_{sc}$ is the number of contacts landing on each of $N_s$ source regions (see also FIG. 4, which shows a MOSFET similar to that shown in FIG. 1 but with multiple contacts to each source region (e.g., $n_{sc}$=2)). In the same manner, the total drain contact resistance is typically modeled based on the assumption that the drain contacts 151-153 are connected in parallel themselves (one end to the node 150). Again, each contact has the same resistance value $R_{dc1}$. Consequently, the prior-art formula applied to determine the total source contact resistance ($R_{tdc}$) is as follows:

$$R_{tdc} = R_{dc1}/(N_d n_{dc}), \qquad \text{(prior art)(5)}$$

where $R_{dc1}$ is the resistance of one of the contacts landing on a given drain region, $N_d$ is the total number of source regions (including both shared and unshared), and $n_{dc}$ is the number of contacts landing on each of $N_d$ drain regions (see also FIG. 4, which shows a MOSFET similar to that shown in FIG. 1 but with multiple contacts to each drain region (e.g., $n_{dc}$=3)).

Figure 10:
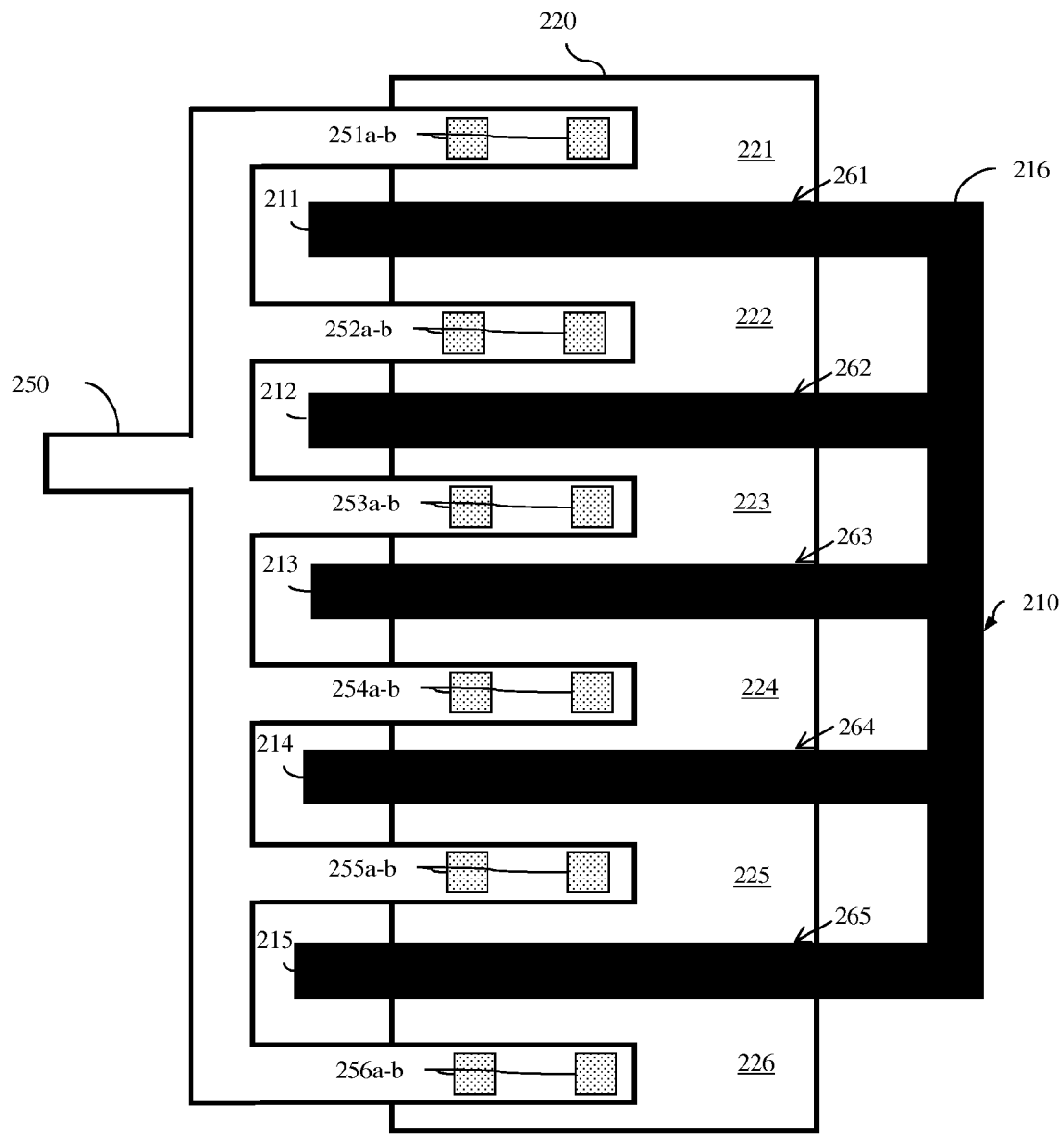
FIG. 10 is a schematic drawing illustrating an alternative MOS varactor having a multi-finger gate structure.

Similarly, for a MOS varactor, such as the MOS varactor 200 described above and illustrated in FIG. 2, the total contact resistance is typically modeled based on the assumption that all of the contacts 251-256 are connected in parallel themselves (one end to the node 250). Typically, each contact has the same resistance value $R_{c1}$. Consequently, the prior-art formula applied to determine the total contact resistance ($R_{tc}$) is as follows:

$$R_{tc} = R_{c1}/[(n_f+1)n_c], \qquad \text{(prior art)(6)}$$

where $R_{c1}$ is the resistance of one of the contacts landing on a given diffusion region, $n_f$ is the number of gate fingers, ($n_f$+1) is the total number of diffusion regions (shared and unshared), and $n_c$ is the number of contacts landing on each of ($n_f$+1) diffusion regions (see also FIG. 10, which shows a similar MOS varactor to that shown in FIG. 2 but with multiple contacts to each diffusion region (e.g., $n_c$=2)).

Unfortunately, application of these formulas can result in relatively large errors in the contract resistance predictions. Specifically, the inventor has found that errors of up to and greater than 10% may occur due to the fact that all of the contacts are actually not connected in parallel themselves and thus the above-mentioned formulas do not apply here. Instead, the inventor has found (i) that the contribution to the total contact resistance from the contact (or, if applicable, the set of all contacts) in each diffusion region is the product of its resistance and the square of the relative electric current passing through it, and (ii) that the electric current passing through the contact (or, if applicable, the set of all contacts) in a shared diffusion region (i.e., in an inner diffusion region) is twice of the electric current passing through the contact (or, if applicable, the set of all contacts) in an unshared diffusion region (i.e., in an outer diffusion region). In other words, shared and unshared contacts should not be treated equally for purposes of accurately determining the total contact resistance in semiconductor devices having a multi-finger gate structure. Therefore, there is a need in the art for technique that can be used to more accurately model the total contact resistance of semiconductor devices, such as metal oxide semiconductor field effect transistors (MOSFETs) or metal oxide semiconductor variable capacitors (MOS varactors), that specifically have a multi-finger gate structure.

Therefore, disclosed herein are method embodiments for modeling contact resistance of semiconductor devices, such as metal oxide semiconductor field effect transistors (MOSFETs) or metal oxide semiconductor variable capacitors (MOS varactors), that specifically have a multi-finger gate structure. In the method embodiments a set of accurate expressions for total contact resistance are presented, in which (i) the total contact resistance is the sum of the resistance contribution from the contact (or, if applicable, the set of all contacts) in each diffusion region (ii) the resistance contribution from the contact (or, if applicable, the set of all contacts) to the total contact resistance is the product of its resistance and the square of the relative electric current passing through it, and (iii) the electric current passing through the contact (or, if applicable, the set of all contacts) in a shared diffusion region (i.e., in an inner diffusion region) is twice of the electric current passing through the contact (or, if applicable, the set of all contacts) in an unshared diffusion region (i.e., in an outer diffusion region). It should be noted that, for MOSFETs, total source contact resistance and total drain contact resistance are computed separately. Also disclosed herein are associated program storage device and computer system embodiments.

Figure 3:
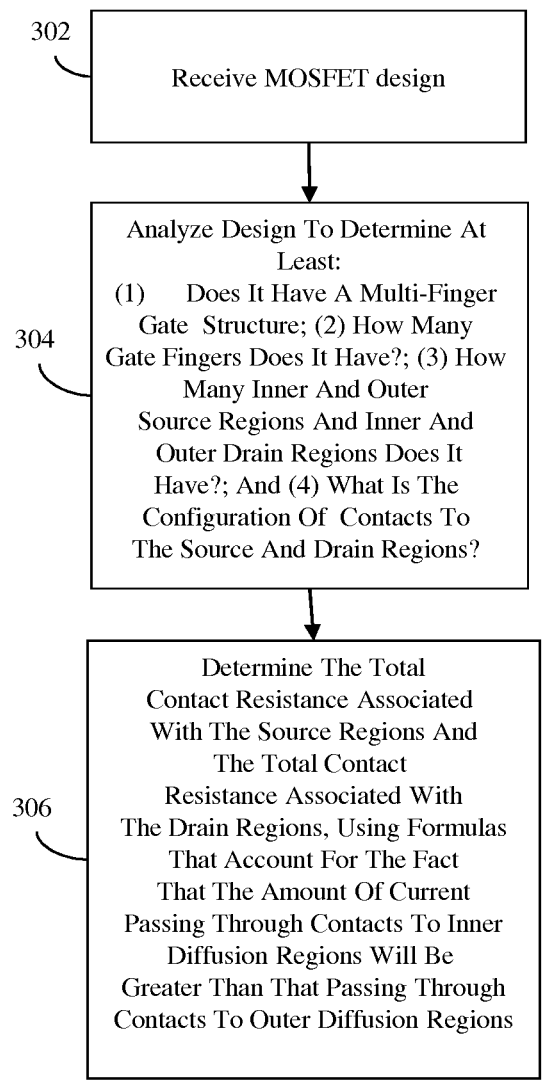
FIG. 3 is a flow diagram illustrating a method embodiment for modeling the total source contact resistance and the total drain contact resistance of a MOSFET having a multi-finger gate structure.

More particularly, referring to FIG. 3, disclosed herein are embodiments of a method of modeling contact resistance for a MOSFET, having a multi-finger gate structure, as well as embodiments of an associated program storage device and an associated computer system.

One exemplary MOSFET having a multi-finger gate structure is the MOSFET 100 described above and illustrated in FIG. 1. Specifically, the MOSFET 100 can comprise a semiconductor body 120. The semiconductor body 120 can comprise multiple diffusion regions (including both source regions 121-123 and drain regions 131-133) and multiple channel regions 161-165 with each channel region being positioned laterally between a source region and a drain region. For example, as illustrated in FIG. 1, channel region 161 can be positioned laterally between source region 121 and drain region 131; channel region 162 can be positioned laterally between drain region 131 and source region 122; and so on. The MOSFET device 100 can further comprise a single gate structure 110 having a main body 116 and multiple essentially parallel fingers 111-115 (also referred to as segments or extensions) extending laterally from one side of the main body 116 across the semiconductor body 120. Each finger 111-115 can be positioned adjacent to (i.e., on, above, etc.) a corresponding channel region 161-165 and, thereby between a source region 121-123 and a drain region 131-133. Furthermore, the layout of source and drain regions within the semiconductor body 120 can be such that a shared source region or a shared drain region is located between adjacent gate fingers. For example, as illustrated in FIG. 1, a shared drain region 131 with shared drain contact(s) 151 is located between gate fingers 111 and 112; a shared source region 122 with shared source contact(s) 142 is located between gate fingers 112 and 113; and so on. Finally, all source contacts 141-143 can be wired to the same node 140 and all drain contacts 151-153 can be wired to the same node 150.

It should be understood that the MOSFET 100 is just one example of a MOSFET having a multi-finger gate structure and is not intended to be limiting. For example, while the MOSFET 100 is shown with a gate structure having five fingers, alternatively the disclosed embodiments could apply to a MOSFET device having a gate structure with any number (even or odd) of fingers. Furthermore, the disclosed embodiments could apply to a MOSFET device having any of multiple other features (e.g., halo regions, extension regions, etc), which are well-known in the art and which are omitted from this specification in order to allow the reader to focus on the salient aspects of the disclosed embodiments.

In the disclosed embodiments, a design for a MOSFET, such as that described above, can be received (e.g., by a computer system via an input device, see detailed discussion below regarding the representative hardware environment depicted in FIG. 14 for practicing the disclosed embodiments) (302). Next, the design can be analyzed (e.g., by a processor in the computer system) to determine at least the following: (1) Is the MOSFET of a type having a multi-finger gate structure; (2) If so, how many fingers does the gate structure of the MOSFET have?; (3) How many inner and outer source regions (i.e., shared and unshared source regions) and inner an outer drain regions (i.e., shared and unshared drain regions) does the MOSFET have?; and (4) What is the configuration of contacts to the source and drain regions 121-123 and 131-133? (304). It should be noted that the configuration of the contacts refers to the number of contacts landing on each source region and the number of contacts landing on each drain region. It also includes whether source contact bars and/or drain contact bars are incorporated into the structure and, if so, whether one or more discrete contacts extend between the source or drain contact bars and the source or drain regions, respectively.

Figure 5:
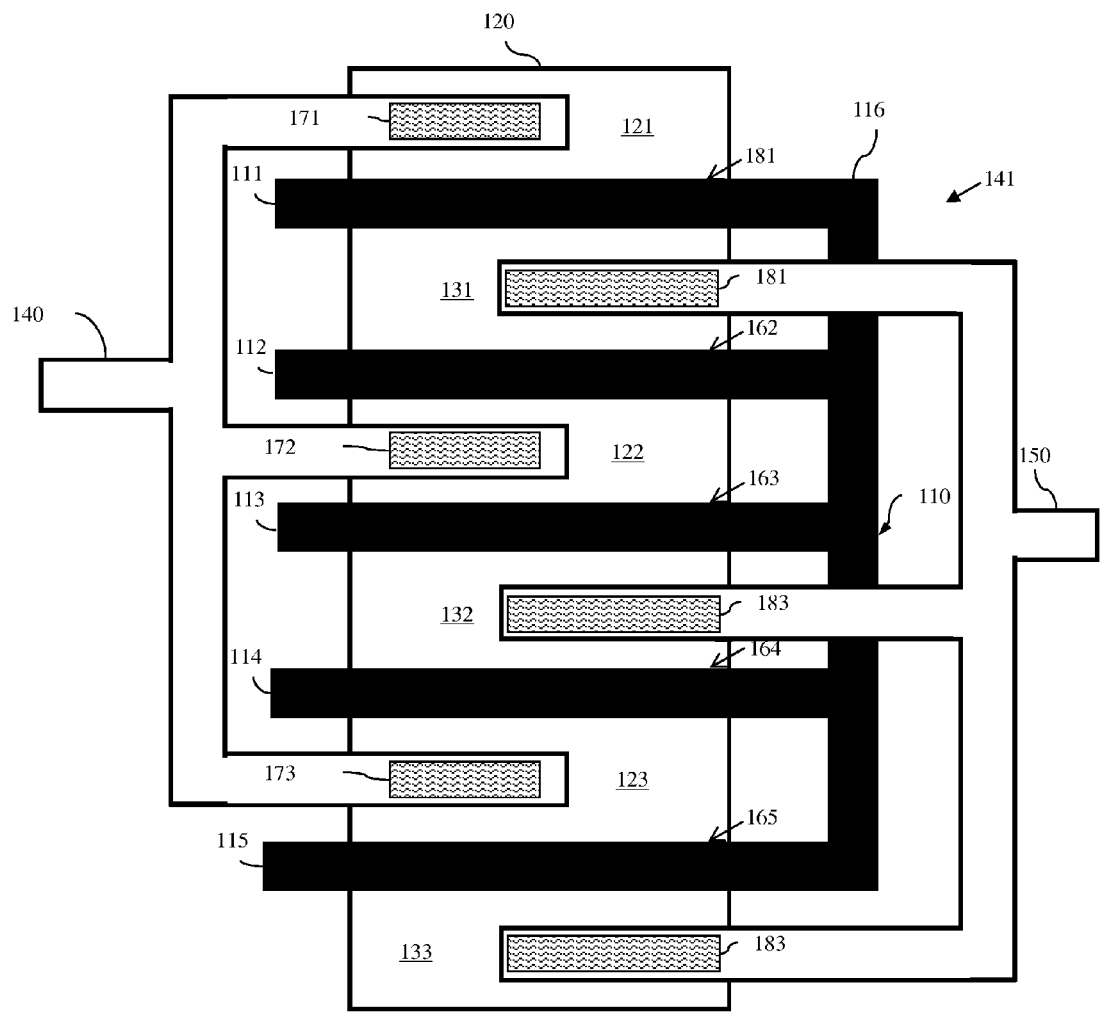
FIG. 5 is a schematic drawing illustrating another alternative MOSFET having a multi-finger gate structure.
Figure 6:
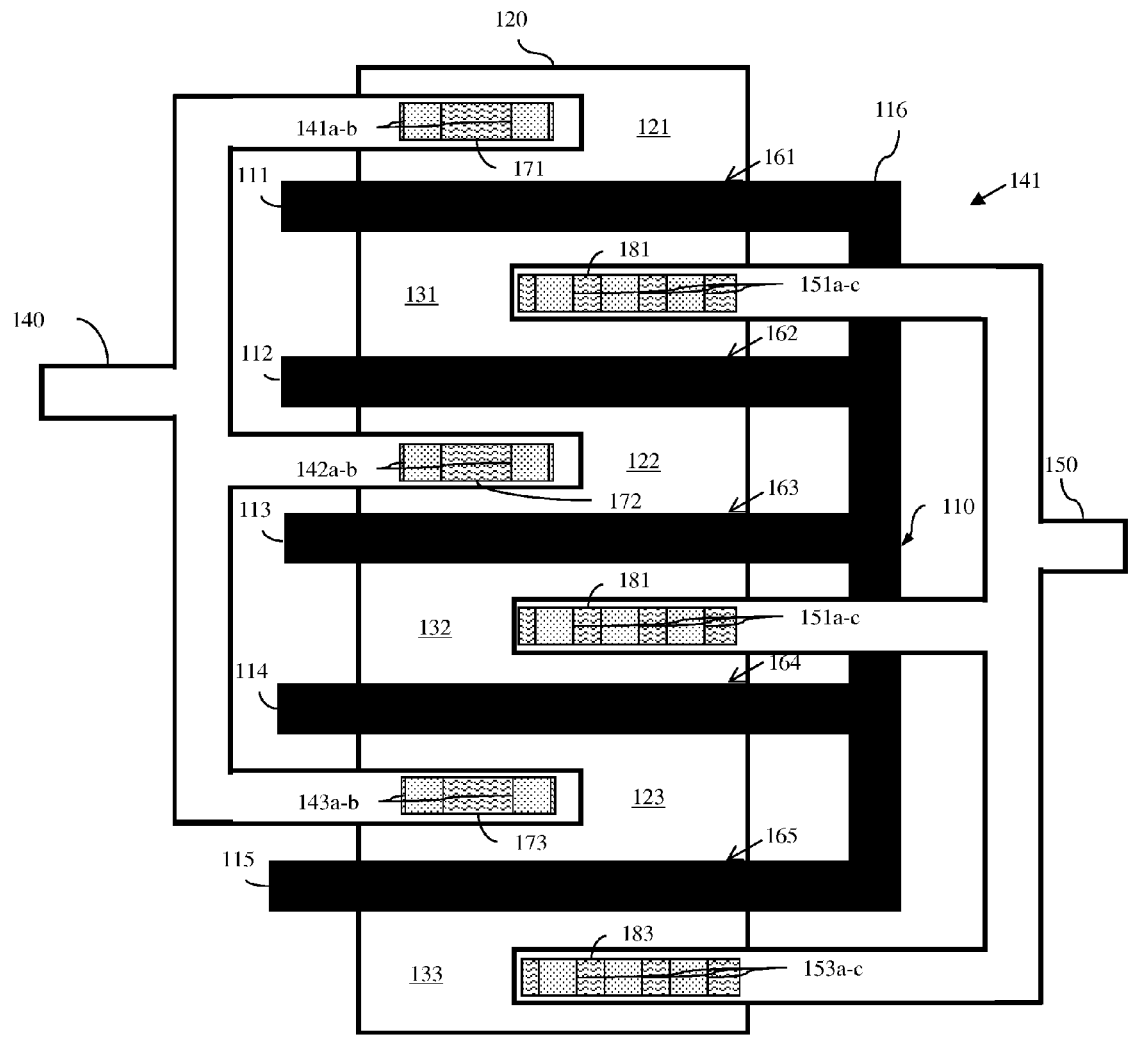
FIG. 6 is a schematic drawing illustrating yet another alternative MOSFET having a multi-finger gate structure.

For example, with regard to the MOSFET 100 of FIG. 1, the analysis at process 302 would determine that the MOSFET 100 has a multi-finger gate structure 110 with five fingers 111-115; one outer source region 121 and two inner source regions 122 and 123; one outer drain region 133 and two inner drain regions 131 and 132; and, a single contact 141, 142 and 143 to each source region 121, 122, and 123, respectively, and a single contact 151, 152 and 153 to each drain region 131, 132 and 133, respectively. With regard to a similar MOSFET structure as shown in FIG. 4, the analysis at process 302 would determine that the MOSFET has a multi-finger gate structure 110 with five fingers 111-115; one outer source region 121 and two inner source regions 122 and 123; one outer drain region 133 and two inner drain regions 131 and 132; and, two contacts 141$a$-$b$, 142$a$-$b$ and 143$a$-$b$ to each source region 121, 122 and 123, respectively, and three contacts 151$a$-$c$, 152$a$-$c$ and 153$a$-$c$ to each drain region 131, 132 and 133, respectively. With regard to another similar MOSFET structure as shown in FIG. 5, the analysis at process 302 would determine that the MOSFET has a multi-finger gate structure 110 with five fingers 111-115; one outer source region 121 and two inner source regions 122 and 123; one outer drain region 133 and two inner drain regions 131 and 132; and, a source contact bar 171, 172 and 173 connected to each source region 121, 122 and 123, respectively, and a drain contact bar 181, 182 and 183 connected to each drain region 131, 132 and 133, respectively. With regard to yet another similar MOSFET structure as shown in FIG. 6, the analysis at process 302 would determine that the MOSFET has a multi-finger gate structure 110 with five fingers 111-11; one outer source region 121 and two inner source regions 122 and 123; one outer drain region 133 and two inner drain regions 131 and 132; and, a source contact bar 171, 172 and 173 with two discrete contacts 141$a$-$b$, 142$a$-$b$, 143$a$-$b$ connected to each source region 121, 122 and 123, respectively, and a drain contact bar 181, 182, and 183 with three discrete contacts 151$a$-$c$, 152$a$-$c$, 153$a$-$c$ connected to each drain region 131, 132 and 133, respectively.

Once the analysis is performed at process 304, both a first total contact resistance associated with the source regions and a second total contact resistance associated with the drain regions can be calculated based on the number of fingers in the gate structure (306). To do this, formulas (i.e., expressions) can be used (i.e., applied, solved, etc.), for example, also by the processor, and these formulas can specifically account for the fact that a first amount of current passing through the contact (or, the set of all contacts) to an inner diffusion region between two fingers of the gate structure will be greater than and, particularly, double a second amount of current passing through the contact (or, the set of all contacts) to an outer diffusion region adjacent to only one finger of the gate structure and, thus, the contribution to the total contact resistance from the contact (or, if applicable, the set of all contacts) in an inner diffusion region is four times the contribution to the total contact resistance from the contact (or, if applicable, the set of all contacts) in an outer diffusion region (when the contact resistance in the inner diffusion region equals the contact resistance in the outer diffusion region).

Figure 7:
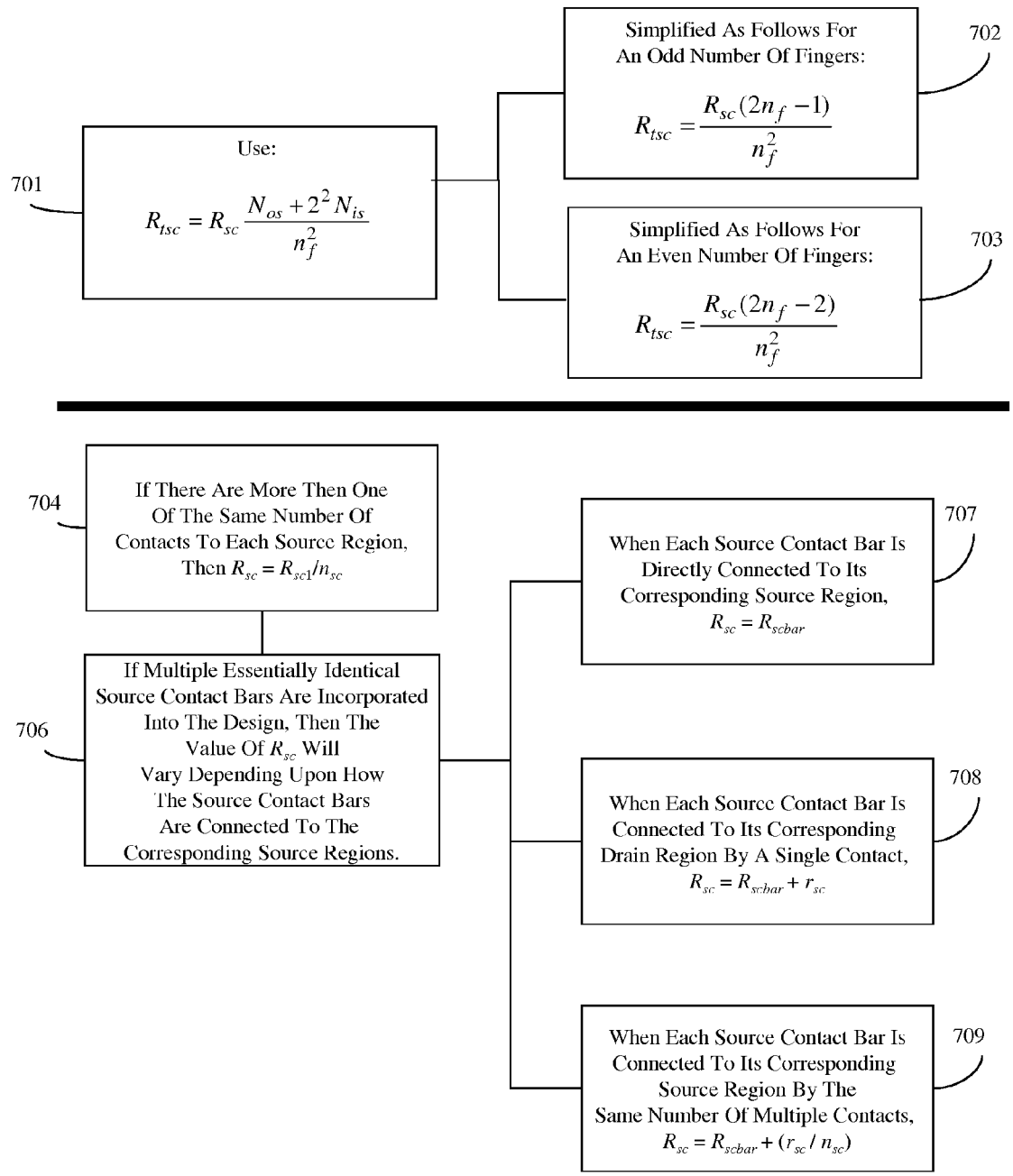
FIG. 7 is diagram illustrating calculation of the total source contact resistance at process 306 of FIG. 3.

For example, referring to FIG. 7, to calculate the first total contact resistance associated with contacts to source regions only, the following first formula can be used (i.e., applied, solved, etc.):

$$R_{tsc} = R_{sc} \frac{N_{os} + 2^2 N_{is}}{n_f^2}, \quad (1)$$

where $R_{tsc}$ is the total resistance of all contacts to all of the source regions, $R_{sc}$ is the resistance of all contacts to one of the source regions (assuming that this resistance value is the same for all source regions), $N_{os}$ is the total number of outer source regions, $N_{is}$ is the total number of inner source regions, and $n_f$ is the number of the gate fingers (701). $N_{os}$, $N_{is}$, and $n_f$ can be determined by analyzing the design layout. In any case, $n_f$ will necessarily be equal to $(N_{os}+2N_{is})$.

In a typical multi-finger MOSFET layout, the number of contacts in each source region is the same for all source regions. For such a layout, the resistance value of all contacts to one of the source regions $R_{sc}$ is the same for all source regions. One exemplary technique for determining the resistance value $R_{sc}$ uses the expression, $$R_{sc} = R_{sc1}/n_{sc}, \quad (7)$$

where $R_{sc1}$ is the resistance of one of the contacts landing on a given source region and $n_{sc}$ is the number of contacts landing on that source region. Those skilled in the art will recognize that the value of $R_{sc1}$ can typically be found in a design manual for the given semiconductor technology. However, other techniques could alternatively be used for determining the resistance value $R_{sc1}$. Such techniques are well-known in the art and, thus, the details are omitted from this specification in order to allow the reader to focus on the salient aspects of the disclosed embodiments.

It should be noted that when the number of fingers $n_f$ is an odd number, one of the two outer diffusion regions will necessarily be a source region and the other will necessarily be a drain region. In this case, the first formula can be simplified at process (702) as follows:

$$R_{tsc} = \frac{R_{sc}(2n_f - 1)}{n_f^2}. \quad (8)$$

However, when the number of fingers $n_f$ is an even number, the two outer diffusion regions will be either both source regions or both drain regions. Designers will typically choose to have the two outer diffusion regions be source regions. Thus, in this case, the first formula can similarly be simplified at process 703 as follows:

$$R_{tsc} = \frac{R_{sc}(2n_f - 2)}{n_f^2}. \quad (9)$$

Additionally, it should be noted that the values of the variables in this first formula for determining the total resistance of all contacts to all of the source regions may vary depending upon the number of contacts at each source region and/or if contact bars are incorporated into the design (704 and 706). For example, if, as determined at process 302 and as shown in FIG. 4, the same number $n_{sc}$ of multiple contacts (e.g., two contacts 141a-b, 142a-b and 143a-b) land on each of the source regions (e.g., 121, 122 and 123, respectively), then in this first formula $R_{sc}$ will be equal to $R_{sc1}/n_{sc}$, where $R_{sc1}$ is the resistance of a single one of the contacts to a single one of the source regions. As mentioned above, those skilled in the art will recognize that the resistance value $R_{sc1}$ can typically be found in a design manual for the given semiconductor technology. However, other techniques for determining the resistance value $R_{sc1}$ could alternatively be used. Such techniques are well-known in the art and, thus, the details are omitted from this specification in order to allow the reader to focus on the salient aspects of the disclosed embodiments.

If, as determined at process 302 and shown in FIGS. 5 and 6, multiple essentially identical source contact bars are incorporated into the design such that each source contact bar is connected to a corresponding source region, the variable in the first formula will vary depending whether the contact bars are directly connected to the corresponding source regions or whether they are connected by the same number of one or more discrete contacts to the corresponding source regions (706).

For example, if, as shown in FIG. 5, each source contact bar 171, 172, and 173 is directly connected to its corresponding source region 121, 122 and 123, respectively, then in the first formula $R_{sc}$ will be equal to $R_{scbar}$, where $R_{scbar}$ is the resistance exhibited by a single one of the source contact bars (707). Those skilled in the art will recognize that the resistance value $R_{scbar}$ of a contact bar of length L can be calculated as a ratio of a contact resistivity (in Ω-m) (which can typically be found in a design manual for the given semiconductor technology) over the length L. However, other techniques for determining the resistance value $R_{scbar}$ could alternatively be used. Such techniques are well-known in the art and, thus, the details are omitted from this specification in order to allow the reader to focus on the salient aspects of the disclosed embodiments.

Alternatively, if, as determined at process 302, a single contact extends from each source contact bar to its corresponding source region, then in the first formula $R_{sc}$ will be equal to $(R_{scbar}+r_{sc})$, where $R_{scbar}$ is the resistance exhibited by a single one of the source contact bars and where $r_{sc}$ is the resistance exhibited by the contact between a source contact bar and its corresponding source region (708). As mentioned above, the resistance value $R_{scbar}$ of a contact bar of length L can be calculated as a ratio of a contact resistivity (in Ω-m) (which can typically be found in a design manual for the given semiconductor technology) over the length L. Furthermore, the resistance value $r_{sc}$ of a contact can also typically be found in a design manual for the given semiconductor technology. However, other techniques for determining the resistance value $r_{sc}$ could alternatively be used. Such techniques are well-known in the art and, thus, the details are omitted from this specification in order to allow the reader to focus on the salient aspects of the disclosed embodiments.

Alternatively, if, as determined at process 302 and shown in FIG. 6, the same number $n_{sc}$ of multiple contacts extend between each source contact bar and its corresponding source region, then in the first formula $R_{sc}$ will be equal to $[R_{scbar}+(r_{sc1}/n_{sc})]$, where $R_{scbar}$ is the resistance of one of the source contact bars and where $r_{sc1}$ is the resistance of a single contact extending from that source contact bar to its corresponding source region (709). As mentioned above, the resistance value $R_{scbar}$ of a contact bar of length L can be calculated as a ratio of a contact resistivity (in Ω-m) (which can typically be found in a design manual of the given semiconductor technology) over the length L and the resistance value $r_{sc1}$ of contact can typically be found in a design manual of a semiconductor technology.

Figure 8:
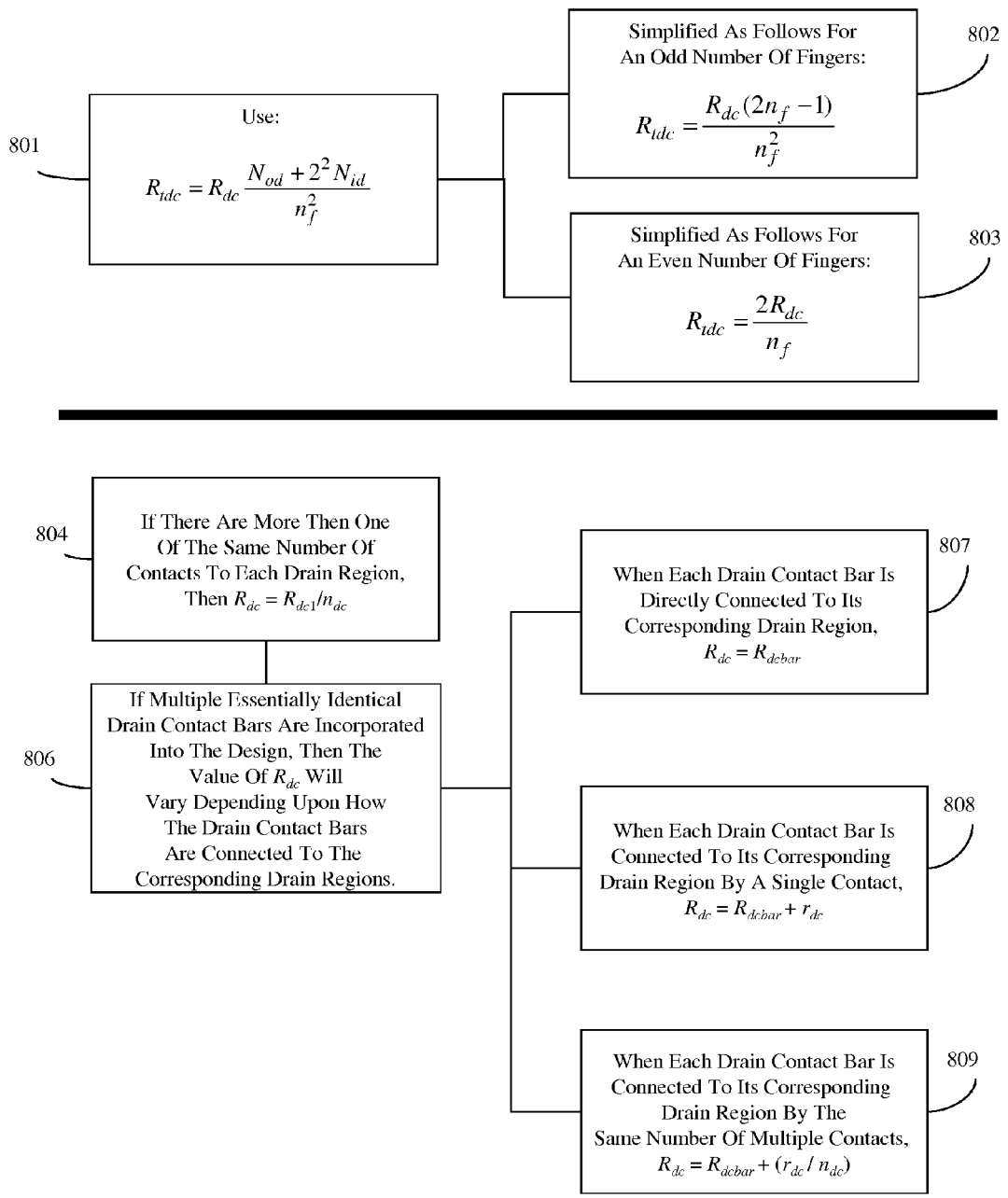
FIG. 8 is diagram illustrating calculation of the total drain contact resistance at process 306 of FIG. 3.

Similarly, referring to FIG. 8, to calculate the second total contact resistance associated with contacts to drain regions only, the following second formula can be used (i.e., applied, solved, etc.):

$$R_{tdc} = R_{dc} \frac{N_{od} + 2^2 N_{id}}{n_f^2}, \qquad (2)$$

where $R_{tdc}$ is the total resistance of all contacts to all of the drain regions, $R_{dc}$ is the resistance of all contacts to one of the drain regions (assuming that this resistance value is the same for all drain regions), $N_{od}$ is the total number of outer drain regions, $N_{id}$ is the total number of inner drain regions, and $n_f$ is the number of the gate fingers (801). $N_{od}$, $N_{id}$, and $n_f$ can be determined by analyzing the design layout. In any case, $n_f$ will necessarily be equal to $(N_{od}+2N_{id})$.

In a typical multi-finger MOSFET layout, the number of contacts in each drain region is the same for all drain regions. For such a layout, the resistance value of all contacts to one of the drain regions $R_{dc}$ is the same for all drain regions. One exemplary technique for determining the resistance value $R_{dc}$ uses the expression, $$R_{dc} = R_{dc1}/n_{dc\_}, \qquad (10)$$

where $R_{dc1}$ is the resistance of one of the contacts landing on a given drain region and $n_{dc}$ is the number of contacts landing on that drain region. Those skilled in the art will recognize that the resistance value $R_{dc1}$ can typically be found in a design manual of the given semiconductor technology. However, other techniques for determining the resistance value $R_{dc1}$ could alternatively be used. Such techniques are well-known in the art and, thus, the details are omitted from this specification in order to allow the reader to focus on the salient aspects of the disclosed embodiments.

As mentioned above, when the number of fingers $n_f$ is an odd number, one of the two outer diffusion regions will necessarily be a source region and the other will necessarily be a drain region. In this case, the second formula can be simplified at process 802 as follows:

$$R_{tdc} = \frac{R_{dc}(2n_f - 1)}{n_f^2}. \qquad (11)$$

However, when the number of fingers $n_f$ is an even number, the two outer diffusion regions will be either both source regions or both drain regions. Since, as discussed above, designers will typically choose to have the two outer diffusion regions be source regions and not drain regions, the second formula can be simplified at process 803 as follows:

$$R_{tdc} = \frac{2R_{sc}}{n_f}. \qquad (12)$$

Additionally, it should be noted that the values of the variables in this second formula for determining the total resistance of all contacts to all of the drain regions may vary depending upon the number of contacts at each drain region and/or if contact bars are incorporated into the design (804 and 806).

For example, if, as determined at process 302 and as shown in FIG. 4, the same number $n_{sc}$ of multiple contacts (e.g., three contacts 151a-b, 152a-b and 153a-b) land on each of the drain regions (e.g., 131, 132 and 133, respectively), then in this second formula $R_{dc}$ will be equal to $R_{dc1}/n_{dc}$, where $R_{dc1}$ is the resistance of a single one of the contacts to a single one of the drain regions. As mentioned above, those skilled in the art will recognize that the resistance value $R_{dc1}$ can typically be found in a design manual of the given semiconductor technology. However, other techniques for determining the resistance value $R_{dc1}$ could alternatively be used. Such techniques are well-known in the art and, thus, the details are omitted from this specification in order to allow the reader to focus on the salient aspects of the disclosed embodiments.

Furthermore, if, as determined at process 302 and shown in FIGS. 5 and 6, multiple essentially identical drain contact bars are incorporated into the design such that each drain contact bar is connected to a corresponding drain region, the formulas will vary depending whether the contact bars are directly connected to the corresponding drain regions or whether they are connected by the same number of one or more discrete contacts to the corresponding drain regions (806).

For example, if, as determined at process 302 and shown in FIG. 5, each drain contact bar 181, 182, and 183 is directly connected to its corresponding drain region 131, 132 and 133, respectively, then in the second formula $R_{dc}$ will be equal to $R_{dcbar}$, where $R_{dcbar}$ is the resistance exhibited by a single one of the drain contact bars (807). Those skilled in the art will recognize that the resistance value $R_{dcbar}$ of a contact bar of length L can be calculated as the ratio of a contact resistivity (in Ω-m) (which can typically be found in a design manual of the given semiconductor technology) over the length L. However, other techniques could alternatively be used to determine the resistance value $R_{dcbar}$. Such techniques are well-known in the art and, thus, the details are omitted from this specification in order to allow the reader to focus on the salient aspects of the disclosed embodiments.

Alternatively, if, as determined at process 302, a single contact extends from each drain contact bar to its corresponding drain region, then in the second formula $R_{dc}$ will be equal to $(R_{dcbar}+r_{dc})$, where $R_{dcbar}$ is the resistance exhibited by a single contact bar in a drain region and where $r_{dc}$ is the resistance exhibited by the contact between a drain contact bar and its corresponding drain region (808). As mentioned above, those skilled in the art will recognize that the resistance value $R_{dcbar}$ of a contact bar of length L can be calculated as the ratio of a contact resistivity (in Ω-m) (which can typically be found in a design manual of the given semiconductor technology) over the length L. However, other techniques for determining the resistance value $R_{dcbar}$ could alternatively be used. Such techniques are well-known in the art and, thus, the details are omitted from this specification in order to allow the reader to focus on the salient aspects of the disclosed embodiments. Furthermore, the resistance value $r_{dc}$ of a contact in a drain region can also typically be found in a design manual of the given semiconductor technology. However, other techniques for determining the resistance value $r_{dc}$ could alternatively be used. Such techniques are well-known in the art and, thus, the details are omitted from this specification in order to allow the reader to focus on the salient aspects of the disclosed embodiments.

Alternatively, if, as determined at process 302 and shown in FIG. 6, the same number $n_{dc}$ of multiple contacts extend between each drain contact bar and its corresponding drain region, then in the second formula $R_{dc}$ will be equal to $[R_{dcbar}+(r_{dc1}/n_{dc})]$, where $R_{dcbar}$ is the resistance of one of the drain contact bars and where $r_{dc1}$ is the resistance of a single contact extending from that drain contact bar to its corresponding drain region (809). As mentioned above, the resistance value $R_{dcbar}$ of a contact bar of length L can be calculated as the ratio of a contact resistivity (in Ω-m) (which can typically be found in a design manual of the given semiconductor technology) over the length L and the resistance value $r_{dc1}$ of a contact in a drain region can typically be found in a design manual of a semiconductor technology.

Figure 9:
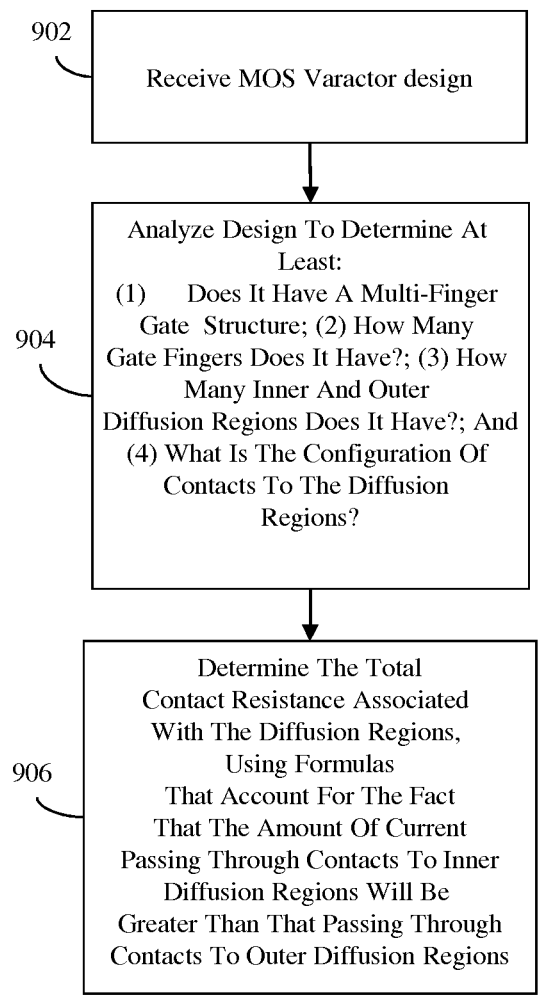
FIG. 9 is a flow diagram illustrating a method embodiment for modeling the total diffusion region contact resistance of a MOS varactor having a multi-finger gate structure.

Referring to FIG. 9, also disclosed herein are embodiments of a method of modeling contact resistance for a MOS varactor, having a multi-finger gate structure, as well as embodiments of an associated program storage device and an associated computer system.

One exemplary MOS varactor having a multi-finger gate structure is the MOS varactor 200 described above and illustrated in FIG. 2. Specifically, the MOS varactor 200 can comprise a semiconductor body 220. This semiconductor body 220 can comprise a well region (e.g., an N-well region or a P-well region) and multiple diffusion regions 221-226 (e.g., N+ diffusion regions or P+ diffusion regions) and multiple channel regions 261-265 within the well region such that each channel region is positioned laterally between two diffusion regions. For example, as illustrated in FIG. 2, channel region 261 is positioned laterally between diffusion regions 221 and 222; channel region 262 is positioned laterally between diffusion regions 222 and 223; and so on. The MOS varactor device 200 can further comprise a single gate structure 210 comprising a main body 216 and multiple essentially parallel fingers 211-215 (also referred to as segments or extensions) extending laterally from one side of the main body 216 across a semiconductor body 220. Each finger 211-215 can be positioned adjacent to (i.e., on, above, etc.) a channel region 261-265 and, thereby positioned between two diffusion regions. For example, as illustrated in FIG. 2, gate finger 211 is positioned adjacent to channel region 261 between diffusion regions 221 and 222; gate finger 212 is positioned adjacent to channel region 262 between diffusion regions 222 and 223; and so on. Furthermore, the layout of the diffusion regions within the semiconductor body 220 can be such that a shared diffusion region with one or more shared contacts is located between adjacent gate fingers. For example, as illustrated in FIG. 2, a shared diffusion region 222 with shared contact(s) 252 is located between gate fingers 211 and 212; a shared diffusion region 223 with shared contact(s) 253 is located between gate fingers 212 and 213; and so on. Finally, all of the diffusion region contacts 251-256 can be wired to the same node 250.

It should be understood that the MOS varactor 200 is just one example of a MOS varactor having a multi-finger gate structure and is not intended to be limiting. For example, while the MOS varactor 200 is shown with a gate structure having five fingers, alternatively the disclosed embodiments could apply to a MOS varactor device having a gate structure with any number (even or odd) of fingers. Furthermore, the disclosed embodiments could apply to a MOS varactor device having any of multiple other features (e.g., halo regions, extension regions, etc), which are well-known in the art and which are omitted from this specification in order to allow the reader to focus on the salient aspects of the disclosed embodiments.

In the disclosed embodiments, a design for a MOS varactor, such as that described above, can be received (e.g., by a computer system via an input device). Next, the design can be analyzed (e.g., by a processor in the computer system, see detailed discussion below regarding the representative hardware environment as depicted in FIG. 14 for practicing the disclosed embodiments) (902). Next, the design can be analyzed (e.g., by a processor in the computer system) to determine at least the following: (1) Is the MOS varactor of a type having a multi-finger gate structure; (2) If so, how many fingers does the gate structure of the MOS varactor have?; (3) How many inner and outer diffusion regions (i.e., shared and unshared diffusion regions) does the MOS varactor have?; and (4) What is the configuration of contacts to the diffusion regions? (904). It should be noted that the configuration of the contacts refers to the number of contacts landing on diffusion region. It also includes whether contact bars are incorporated into the structure and, if so, whether one or more discrete contacts extend between the contact bars and the diffusion regions.

Figure 11:
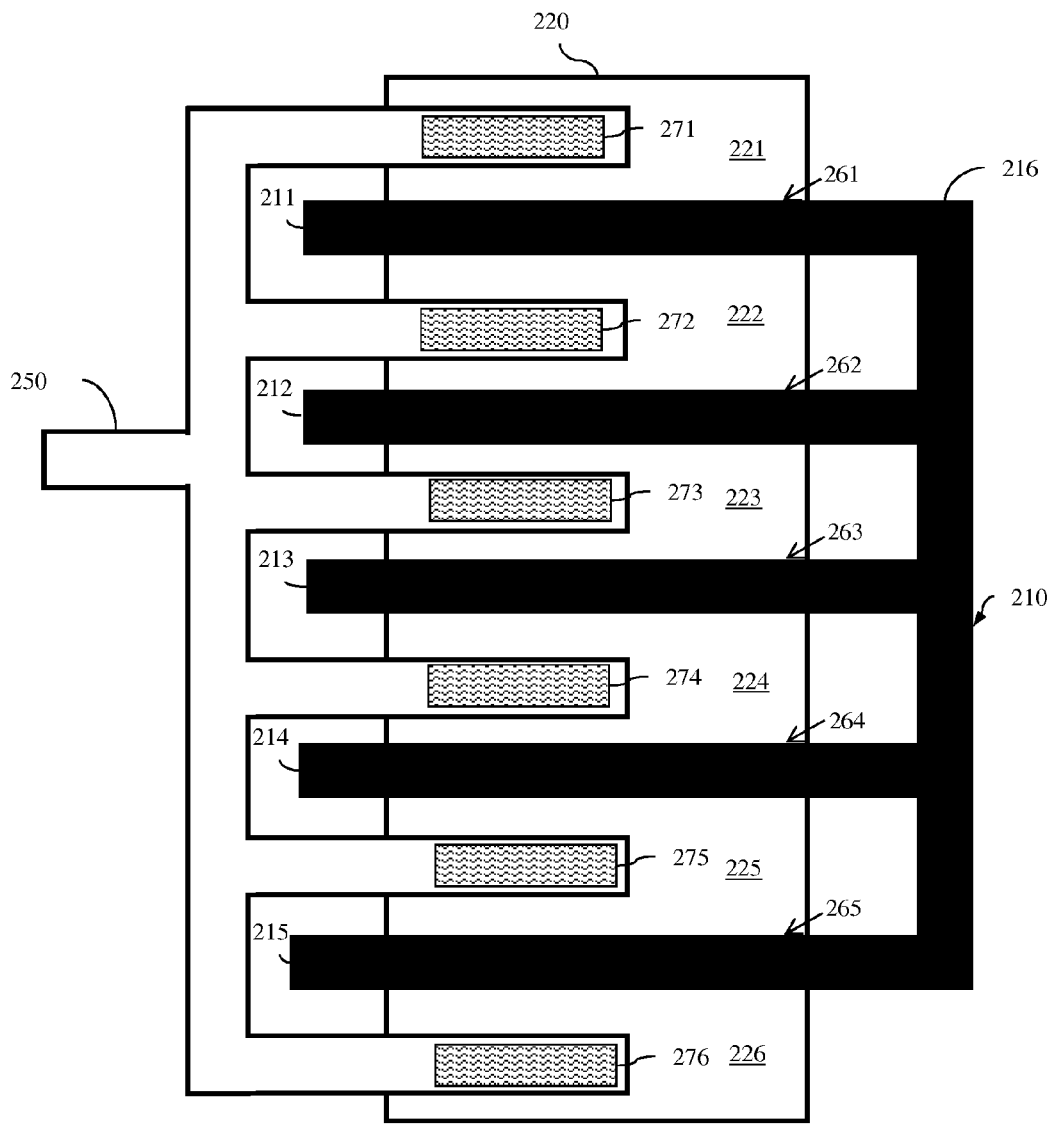
FIG. 11 is a schematic drawing illustrating another alternative MOS varactor having a multi-finger gate structure.
Figure 12:
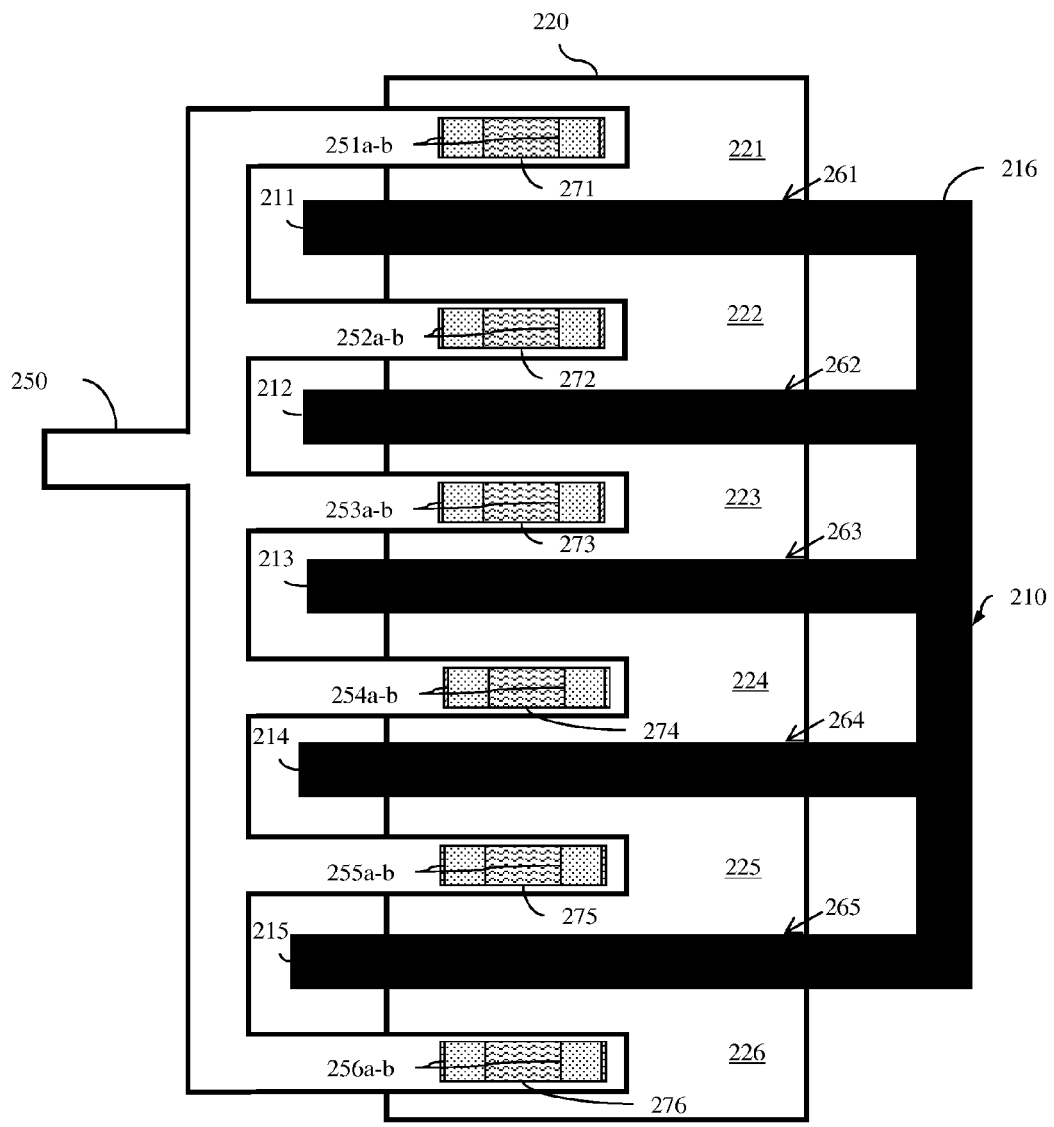
FIG. 12 is a schematic drawing illustrating yet another alternative MOS varactor having a multi-finger gate structure.

For example, with regard to the MOS varactor 200 of FIG. 2, the analysis at process 902 would determine that the MOS varactor 200 has a multi-finger gate structure 210 with five fingers 211-215; two outer diffusion regions 221 and 226 and four inner diffusion regions 222-225; and, a single contact 241-246 to each diffusion region, respectively. With regard to a similar MOS varactor structure as shown in FIG. 10, the analysis at process 302 would determine that the MOS varactor has a multi-finger gate structure 210 with five fingers 211-215; two outer diffusion regions 221 and 226 and four inner diffusion regions 222-225; and, two contacts 251*a-b*, 252*a-b*, etc. to each diffusion region 221, 222, etc., respectively. With regard to another similar MOS varactor structure as shown in FIG. 11, the analysis at process 302 would determine that the MOS varactor has a multi-finger gate structure 210 with five fingers 211-215; two outer diffusion regions 221 and 226 and four inner diffusion regions 222-225; and, a contact bar 271-276 connected to each diffusion region 221-226, respectively. With regard to yet another similar MOSFET structure as shown in FIG. 12, the analysis at process 302 would determine that the MOS varactor has a multi-finger gate structure 210 with five fingers 211-215; two outer diffusion regions 221 and 226 and four inner diffusion regions 222-225; and, a contact bar 271-276 with two discrete contacts 251*a-b*, 252*a-b*, etc. connected to each diffusion region 221-226, respectively.

Once the analysis is performed at process 904, the total contact resistance associated with the diffusion regions can be calculated based on the number of fingers in the gate structure. To do this, a formula (i.e., expression) can be used (i.e., applied, solved, etc.), for example, by the processor, and this formula can specifically account for the fact that a first amount of current passing through the contact (or, the set of all contacts) to an inner diffusion region between two fingers of the gate structure will be greater than and, particularly, double a second amount of current passing through the contact (or, the set of all contacts) to an outer diffusion region adjacent to only one finger of the gate structure and, thus, the contribution to the total contact resistance from the contact (or, the set of all contacts) in an inner diffusion region will be larger than, and, particularly, will be four times of the contribution to the total contact resistance from the contact (or, the set of all contacts) in an outer diffusion region (906) (assuming that the contact resistance in an inner diffusion region equals the contact resistance in an outer diffusion region).

Figure 13:
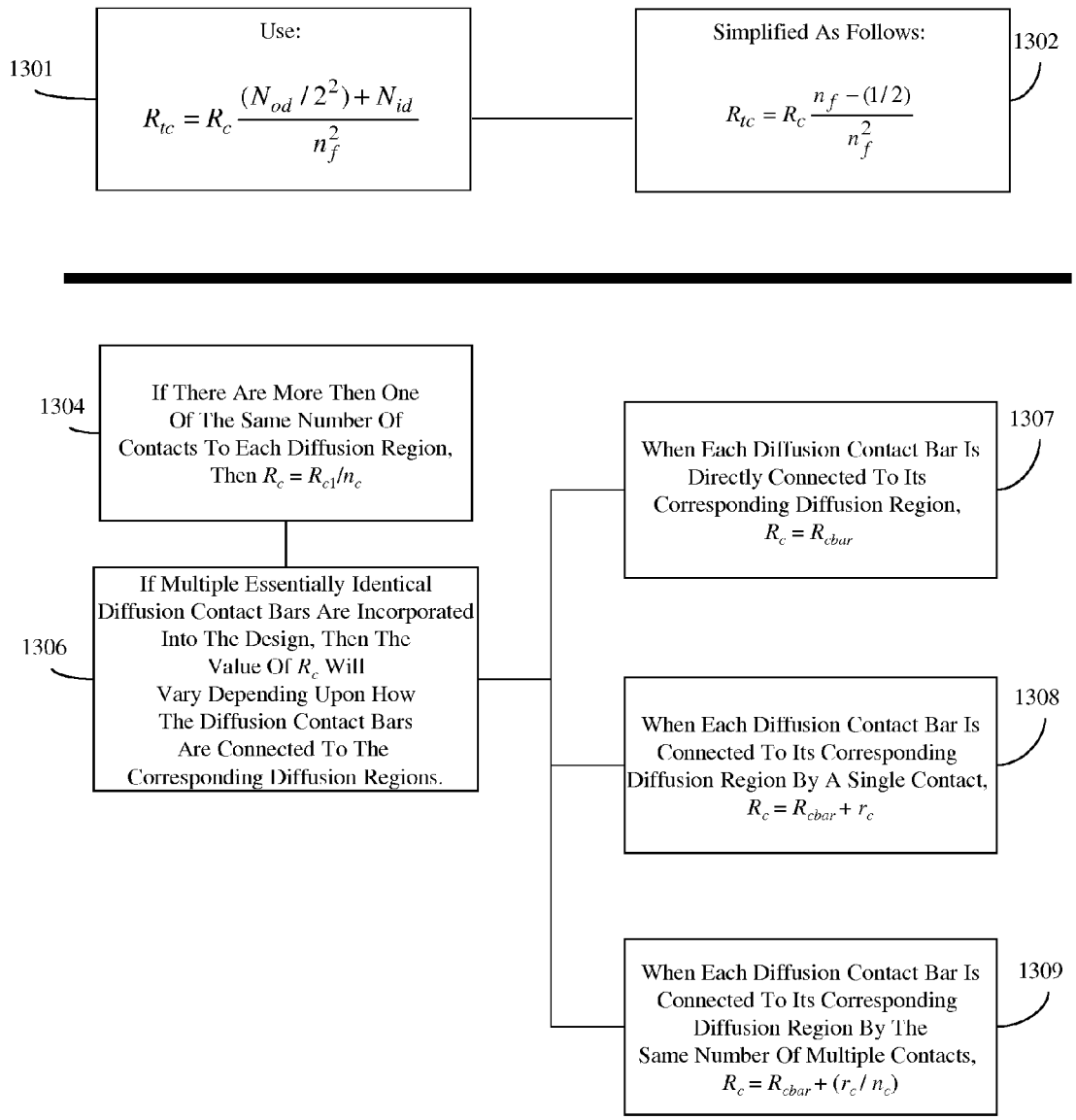
FIG. 13 is diagram illustrating calculation of the total contact resistance at process 906 of FIG. 9.

For example, referring to FIG. 13, to calculate the total contact resistance associated with contacts to the diffusion regions of the MOS varactor, the following formula (i.e., expression) can be used (i.e., applied, solved, etc.):

$$R_{tc} = R_c \frac{(N_{od}/2^2) + N_{id}}{n_f^2}, \quad (3)$$

where $R_{tc}$ is the total resistance of all contacts to all of the diffusion regions, $R_c$ is the resistance of all contacts to one of the diffusion regions (assuming that this resistance is the same for all diffusion regions), $N_{od}$ is the total number of outer diffusion regions, $N_{id}$ is the total number of inner diffusion regions, and $n_f$ is the number of the gate fingers (1301). The value of $R_c$ (i.e., the resistance of all contacts to one of the diffusion regions) can be determined uses the expression, $$R_c = R_{c1}/n_c \quad (13)$$

where $R_{c1}$ is the resistance of one of the contacts landing on a given diffusion region and $n_c$ is the number of contacts landing on that diffusion region. Those skilled in the art will recognize that the value of $R_{c1}$ can typically be found in a design manual of the given semiconductor technology. However, other techniques for determining the resistance value $R_{c1}$ could alternatively be used. Such techniques are well-known in the art and, thus, the details are omitted from this specification in order to allow the reader to focus on the salient aspects of the disclosed embodiments. $N_{od}$ (i.e., the total number of outer diffusion regions) will be equal to two. However, $N_d$ (i.e., the total number of inner diffusion regions) and $n_f$ (i.e., the number of the gate fingers) can only be determined by analyzing the design at process 904 discussed above. In any case, $n_f$ will necessarily be equal to $(N_{os}+2N_{is})$ and, thus, the formula can be simplified (1302), as follows:

$$R_{tc} = R_c \frac{n_f - \frac{1}{2}}{n_f^2}. \quad (14)$$

Additionally, it should be noted that the values of the variables in this formula for determining the total resistance of all contacts to all of the diffusion regions may vary depending upon the number of contacts at each diffusion region and/or if contact bars are incorporated into the design (1304 and 1306).

For example, if, as determined at process 902 and as shown in FIG. 10, the same number $n_c$ of multiple contacts (e.g., two contacts 251a-b, 252a-b, etc.) land on each of the diffusion regions (e.g., 221, 222, etc., respectively), then in this formula $R_c$ will be equal to $R_{c1}/n_c$, where $R_{c1}$ is the resistance of a single one of the contacts to a single one of the diffusion regions. As mentioned above, those skilled in the art will recognize that the resistance value $R_{c1}$ can typically be found in a design manual of the given semiconductor technology. However, other techniques for determining the resistance value $R_{c1}$ could alternatively be used. Such techniques are well-known in the art and, thus, the details are omitted from this specification in order to allow the reader to focus on the salient aspects of the disclosed embodiments.

Furthermore, if, as determined at process 902 and shown in FIGS. 11 and 12, multiple essentially identical contact bars are incorporated into the design such that each contact bar is connected to a corresponding diffusion region, the variables in the formula may vary depending whether the contact bars are directly connected to the corresponding diffusion regions or whether they are connected by the same number of one or more discrete contacts to the corresponding diffusion regions (1306).

For example, if, as determined at process 902 and shown in FIG. 11, each contact bar 271-276 is directly connected to its corresponding diffusion region 221-226, then in the formula $R_c$ will be equal to $R_{cbar}$, where $R_{cbar}$ is the resistance exhibited by a single contact bars (1307). Those skilled in the art will recognize that the resistance value $R_{cbar}$ of a contact bar of length L can be calculated as the ratio of a contact resistivity (in Ω-m) (which is typically given in a design manual of a semiconductor technology) over the length L. However, other techniques for determining the resistance value $R_{cbar}$ could alternatively be used. Such techniques are well-known in the art and, thus, the details are omitted from this specification in order to allow the reader to focus on the salient aspects of the disclosed embodiments.

Alternatively, if, as determined at process 902, a single contact extends from each contact bar to its corresponding diffusion region, then in the formula $R_c$ will be equal to $(R_{cbar}+r_c)$, where $R_{cbar}$ is the resistance exhibited by a single one of the contact bars and where $r_c$ is the resistance exhibited by the contact between a contact bar and its corresponding diffusion region (1308). As mentioned above, those skilled in the art will recognize that the resistance value $R_{cbar}$ of a contact bar of length L can be calculated as a ratio of a contact resistivity (in Ω-m) (which can typically be found in a design manual of the given semiconductor technology) over the length L. Additionally, those skilled in the art will recognize that the resistance value $r_c$ of a contact can also typically be found in a design manual of the given semiconductor technology. However, other techniques for determining the resistance values $R_{cbar}$ and $r_c$ could alternatively be used. Such techniques are well-known in the art and, thus, the details are omitted from this specification in order to allow the reader to focus on the salient aspects of the disclosed embodiments.

Alternatively, if, as determined at process 902 and shown in FIG. 12, the same number $n_c$ of multiple contacts extend between each contact bar and its corresponding diffusion region, then in the formula $R_c$ will be equal to $[R_{cbar}+(r_{c1}/n_c)]$, where $R_{cbar}$ is the resistance of one of the contact bars and where $r_{c1}$ is the resistance of a single contact extending from that contact bar to its corresponding diffusion region (1309). As mentioned above, the resistance value $R_{cbar}$ of a contact bar of length L can be calculated as a ratio of a contact resistivity (in Ω-m) (which can typically be found in a design manual of the given semiconductor technology) over the length L and the resistance value $r_{c1}$ of a contact can also typically be found in a design manual of the given semiconductor technology.

Also disclosed herein are embodiments of non-transitory program storage devices associated with each of the method embodiments described above. Specifically, disclosed herein are program storage devices which can be readable by a computer and which can tangibly embody a program of instructions executable by the computer to perform any of the above-described methods of modeling contact resistance. As will be appreciated by one skilled in the art, aspects of the disclosed embodiments may be embodied as a system, method or computer program product. Accordingly, aspects of the disclosed embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the disclosed embodiments may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the disclosed embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the disclosed embodiments are described below with reference to flowchart illustrations and/or block diagrams of methods, apparatus (systems) and computer program products. It will be understood that each block of the flowchart illustrations and/or D-2 block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 14:
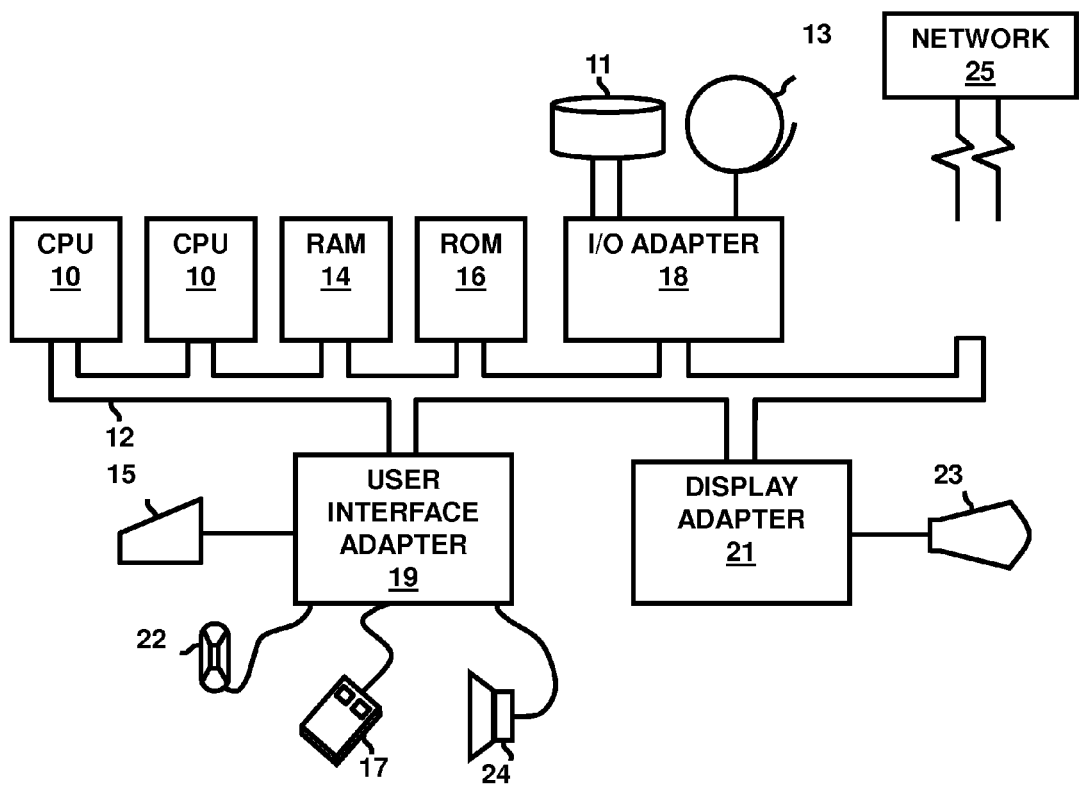
FIG. 14 is a schematic diagram illustrating an exemplary hardware environment that can be used to implement the system and method embodiments.

A representative hardware environment for practicing the disclosed embodiments is depicted in FIG. 14. This schematic drawing illustrates a hardware configuration of an information handling/computer system in accordance with the disclosed embodiments. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the disclosed method embodiments. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the flowchart and block diagrams in the Figures illustrate the architecture, functionality, and operation of possible implementations of systems, methods and computer program products according to the disclosed embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should further be understood that the terminology used herein is for the purpose of describing particular embodiments only and is not intended to be limiting. As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The description of the disclosed embodiments has been presented for purposes of illustration and description, but is not intended to be exhaustive or limiting. Many modifications and variations will be apparent to those of ordinary skill in the art without departing from the scope and spirit of the disclosed embodiments. The disclosed embodiments were chosen and described for illustration purposes and it should be understood that various embodiments with various modifications as are suited to the particular use are contemplated.

Therefore, disclosed above are method embodiments for modeling contact resistance of semiconductor devices, such as metal oxide semiconductor field effect transistors (MOSFETs) or metal oxide semiconductor variable capacitors (MOS varactors), that specifically have a multi-finger gate structure. In the method embodiments a set of accurate expressions for total contact resistance are presented, in which (i) the total contact resistance is the sum of the resistance contribution from the contact (or, if applicable, the set of all contacts) in each diffusion region, (ii) the resistance contribution from the contact (or, if applicable, set of all contacts) on each diffusion region to the total contact resistance is the product of its resistance and the square of the relative electric current passing through it, and (iii) the electric current passing through the contact (or, if applicable, set of all contacts) in a shared diffusion region (i.e., in an inner diffusion region) is twice of the electric current passing through the contact (or, if applicable, set of all contacts) in an unshared diffusion region (i.e., in an outer diffusion region). It should be noted that, for MOSFETs, total source contact resistance and total drain contact resistance are computed separately. Also disclosed herein are associated program storage device and computer system embodiments. The total contact resistance determined pursuant to these embodiments is more accurate than that determined by prior art techniques because these embodiments take into account the fact that the resistance value of the contact (or, if applicable, set of all contacts) in an unshared diffusion region (i.e., to an outer diffusion region) is impacted by current flow under only one gate finger, whereas the resistance value of the contact (or, if applicable set of all contacts) in a shared diffusion region (i.e., to as an inner diffusion region) is impacted by current flow under not one, but two, adjacent gate fingers.

What is claimed is:

1. A method of modeling contact resistance for a field effect transistor,
said field effect transistor comprising:
a semiconductor body comprising:
multiple diffusion regions comprising:
source regions; and
drain regions; and
multiple channel regions, each channel region being positioned between a source region and a drain region;
a gate structure having multiple fingers, each finger traversing said semiconductor body adjacent to a corresponding channel region and between a source region and a drain region associated with said corresponding channel region; and
multiple contacts to said multiple diffusion regions; and, said method comprising:
analyzing a design of said field effect transistor to determine a number of said fingers, using a computer; and
calculating, based on said number of said fingers, a first total contact resistance associated with said source regions and a second total contact resistance associated with said drain regions, using said computer, said calculating comprising using formulas which account for a first amount of current passing through all contacts to an inner diffusion region between two fingers of said gate structure being greater than a second amount of current passing through all contacts to an outer diffusion region adjacent to only one finger of said gate structure.

2. The method of claim 1, wherein said calculating a first total contact resistance comprising using a first formula, said first formula comprising:

$$R_{tsc} = R_{sc} \frac{N_{os} + 2^2 N_{is}}{n_f^2},$$

where $R_{tsc}$ is total resistance of all contacts to all of said source regions, $R_{sc}$ is resistance of all contacts to each of said source regions, $N_{os}$ is total number of outer source regions, $N_{is}$ is total number of inner source regions and $n_f$ is a number of said fingers of said gate structure.

3. The method of claim 2, wherein said field effect transistor further comprising a number $n_{sc}$ of contacts to each of said source regions and said first formula being used, where $R_{sc}=R_{sc1}/n_{sc}$ and where $R_{sc1}$ is resistance of a single one of said contacts to said one of said source regions.

4. The method of claim 2, wherein said field effect transistor further comprising multiple essentially identical source contact bars, each source contact bar being positioned above a corresponding source region and having a number $n_{sc}$ of contacts to said corresponding source region and first formula being used, where $R_{sc}=R_{scbar1}+(r_{sc1}/n_{sc})$, where $R_{scbar}$ is resistance of said each source contact bar and where $r_{sc1}$ is resistance of a single contact extending from said source contact bar to said corresponding source region.

5. The method of claim 2, wherein said first formula being simplified as follows:

$$R_{tsc} = \frac{R_{sc}(2n_f - 1)}{n_f^2}$$

when $n_f$=an odd number, $$R_{tsc} = \frac{R_{sc}(2n_f - 2)}{n_f^2}$$

when $n_f$=an even number.

6. The method of claim 1, wherein said calculating of said second total contact resistance comprising using a second formula, said second formula comprising:

$$R_{tdc} = R_{dc}\frac{N_{od} + 2^2 N_{id}}{n_f^2},$$

where $R_{tdc}$ is total resistance of all contacts to all of said drain regions, $R_{dc}$ is resistance of all contacts to each of said drain regions, $N_{od}$ is total number of outer drain regions, $N_{id}$ is total number of inner drain regions and $n_f$ is a number of said fingers of said gate structure.

7. The method of claim 6, wherein said field effect transistor further comprising a same number $n_{dc}$ of contacts to each of said drain regions and said second formula being used, where $R_{dc}=R_{dc1}/n_{dc}$ and where $R_{dc1}$ is resistance of a single one of said contacts to said one of said drain regions.

8. The method of claim 6, wherein said field effect transistor further comprising multiple essentially identical drain contact bars, each drain contact bar being positioned above a corresponding drain region and having a same number $n_{dc}$ of contacts to said corresponding drain region and said second formula being used, where $R_{dc}=R_{dcbar1}+(r_{dc1}/n_{dc})$, where $R_{dcbar}$ is resistance of said each drain contact bar and where $r_{dc1}$ is resistance of a single contact extending from said drain contact bar to said corresponding drain region.

9. The method of claim 6, wherein said second formula being simplified as follows:

$$R_{tdc} = \frac{R_{dc}(2n_f - 1)}{n_f^2}$$

when $n_f$=an odd number $$R_{tdc} = \frac{2R_{sc}}{n_f}$$

when $n_f$=an even number.

10. A non-transitory program storage device readable by a computer and tangibly embodying a program of instructions executable by said computer to perform a method of modeling contact resistance for a field effect transistor,
said field effect transistor comprising:
a semiconductor body comprising:
multiple diffusion regions comprising:
source regions; and
drain regions; and
multiple channel regions, each channel region being positioned between a source region and a drain region;
a gate structure having multiple fingers, each finger traversing said semiconductor body adjacent to a corresponding channel region and between a source region and a drain region associated with said corresponding channel region; and
multiple contacts to said multiple diffusion regions; and,
said method comprising:
analyzing a design of said field effect transistor to determine a number of said fingers; and
calculating, based on said number of said fingers, a first total contact resistance associated with said source regions and a second total contact resistance associated with said drain regions, said calculating comprising using formulas which account for a first amount of current passing through all contacts to an inner diffusion region between two fingers of said gate structure being greater than a second amount of current passing through all contacts to an outer diffusion region adjacent to only one finger of said gate structure.

11. The program storage device of claim 10, wherein said calculating a first total contact resistance comprising using a first formula, said first formula comprising:

$$R_{tsc} = R_{sc}\frac{N_{os} + 2^2 N_{is}}{n_f^2},$$

where $R_{tsc}$ is total resistance of all contacts to all of said source regions, $R_{sc}$ is resistance of all contacts to each of said source regions, $N_{os}$ is total number of outer source regions, $N_{is}$ is total number of inner source regions and $n_f$ is a number of said fingers of said gate structure, and
said calculating a second total contact resistance comprising using a second formula, said second formula comprising:

$$R_{tdc} = R_{dc}\frac{N_{od} + 2^2 N_{id}}{n_f^2},$$

where $R_{tdc}$ is total resistance of all contacts to all of said drain regions, $R_{dc}$ is resistance of all contacts to each of said drain regions, $N_{od}$ is total number of outer drain regions, $N_{id}$ is total number of inner drain regions and $n_f$ is a number of said fingers of said gate structure.

12. The program storage device of claim 11, wherein said field effect transistor further comprising a number $n_{sc}$ of contacts to each of said source regions and a same number $n_{dc}$ of contacts to each of said drain regions,
said first formula being used, where $R_{sc}=R_{sc1}/n_{sc}$ and where $R_{sc1}$ is resistance of a single one of said contacts to said one of said source regions, and
said second formula being used, where $R_{dc}=R_{dc1}/n_{dc}$ and where $R_{dc1}$ is resistance of a single one of said contacts to said one of said drain regions.

13. A system of modeling contact resistance of a field effect transistor, said system comprising:
an input device receiving a design for a field effect transistor, said field effect transistor comprising:
a semiconductor body comprising:
multiple diffusion regions comprising:
source regions; and
drain regions; and
multiple channel regions, each channel region being positioned between a source region and a drain region;
a gate structure having multiple fingers, each finger traversing said semiconductor body adjacent to a corresponding channel region and between a source region and a drain region associated with said corresponding channel region; and
multiple contacts to said multiple diffusion regions; and
a processor in communication with said input device, said processor analyzing said design of said field effect transistor to determine a number of said fingers and further calculating, based on said number of said fingers, a first total contact resistance associated with said source regions and a second total contact resistance associated with said drain regions, said calculating comprising using formulas which account for a first amount of current passing through all contacts to an inner diffusion region between two fingers of said gate structure being greater than a second amount of current passing through all contacts to an outer diffusion region adjacent to only one finger of said gate structure.

14. The system of claim 13, wherein said calculating a first total contact resistance comprising using a first formula, said first formula comprising:

$$R_{tsc} = R_{sc}\frac{N_{os} + 2^2 N_{is}}{n_f^2},$$

where $R_{tsc}$ is total resistance of all contacts to all of said source regions, $R_{sc}$ is resistance of all contacts to each of said source regions, $N_{os}$ is total number of outer source regions, $N_{is}$ is total number of inner source regions and $n_f$ is a number of said fingers of said gate structure, and said calculating a second total contact resistance comprising using a second formula, said second formula comprising:

$$R_{tdc} = R_{dc}\frac{N_{od} + 2^2 N_{id}}{n_f^2},$$

where $R_{tdc}$ is total resistance of all contacts to all of said drain regions, $R_{dc}$ is resistance of all contacts to each of said drain regions, $N_{od}$ is total number of outer drain regions, $N_{id}$ is total number of inner drain regions and $n_f$ is a number of said fingers of said gate structure.

15. The system of claim 14, wherein said field effect transistor further comprising a number $n_{sc}$ of contacts to each of said source regions and a same number $n_{dc}$ of contacts to each of said drain regions, said first formula being used, where $R_{sc}=R_{sc1}/n_{sc}$ and where $R_{sc1}$ is resistance of a single one of said contacts to said one of said source regions, and said second formula being used, where $R_{dc}=R_{dc1}/n_{dc}$ and where $R_{dc1}$ is resistance of a single one of said contacts to said one of said drain regions.

16. A method of modeling contact resistance for a capacitor, said capacitor comprising:
a semiconductor body comprising:
multiple diffusion regions; and
multiple channel regions, each channel region being positioned between two of said diffusion regions;
a gate structure having multiple fingers, each finger traversing said semiconductor body adjacent to a corresponding channel region and between two of said diffusion regions associated with said corresponding channel region; and
multiple contacts to said multiple diffusion regions; and
said method comprising:
analyzing a design of said capacitor to determine a number of said fingers, using a computer; and
calculating, based on said number of said fingers, a total contact resistance associated with said diffusion regions using said computer, said calculating comprising using a formula which accounts for a first amount of current passing through all contacts to an inner diffusion region between two fingers of said gate structure being greater than a second amount of current passing through all contacts to an outer diffusion region adjacent to only one finger of said gate structure.

17. The method of claim 16, wherein said calculating a first total contact resistance comprising using a first formula, said first formula comprising:

$$R_{tc} = R_c\frac{(N_{od}/2^2) + N_{id}}{n_f^2},$$

where $R_{tc}$ is total resistance of all contacts to all of said diffusion regions, $R_c$ is resistance of all contacts to one of said diffusion regions, $N_{od}$ is total number of outer diffusion regions, $N_{id}$ is total number of inner diffusion regions and $n_f$ is a number of said fingers of said gate structure.

18. The method of claim 17, wherein said capacitor further comprising a same number $n_c$ of contacts to each of said diffusion regions and said formula being used, where $R_c=R_{c1}/n_c$ and where $R_{c1}$ is resistance of a single one of said contacts to said one of said diffusion regions.

19. The method of claim 17, wherein said capacitor comprising multiple essentially identical diffusion region contact bars, each diffusion region contact bar being positioned above a corresponding diffusion region and having a same number $n_c$ of contacts to said corresponding diffusion region and said formula being used, where $R_c=R_{cbar1+(rc1}/n_c)$, where $R_{cbar}$ is resistance of said each diffusion region contact bar and where $r_{c1}$ is resistance of a single contact extending from said diffusion region contact bar to said corresponding diffusion region.

20. A non-transitory program storage device readable by a computer and tangibly embodying a program of instructions executable by said computer to perform a method of modeling contact resistance for a capacitor, said capacitor comprising:
a semiconductor body comprising:
multiple diffusion regions; and
multiple channel regions, each channel region being positioned between two of said diffusion regions;
a gate structure having multiple fingers, each finger traversing said semiconductor body adjacent to a corresponding channel region and between two of said diffusion regions associated with said corresponding channel region; and
multiple contacts to said multiple diffusion regions; and,
said method comprising:
analyzing a design of said capacitor to determine a number of said fingers; and
calculating, based on said number of said fingers, a total contact resistance associated with said diffusion regions, said calculating comprising using a formula which accounts for a first amount of current passing through all contacts to an inner diffusion region between two fingers of said gate structure being greater than a second amount of current passing through all contacts to an outer diffusion region adjacent to only one finger of said gate structure.

21. A system for modeling contact resistance for a metal oxide semiconductor variable capacitor (MOS varactor), said system comprising:

an input device receiving a design for a MOS varactor, said MOS varactor comprising:
a semiconductor body comprising:
multiple diffusion regions; and
multiple channel regions, each channel region being positioned between two of said diffusion regions;

a gate structure having multiple fingers, each finger traversing said semiconductor body adjacent to a corresponding channel region and between two of said diffusion regions associated with said corresponding channel region; and multiple contacts to said multiple diffusion regions; and, a processor in communication with said input device, said processor analyzing said design of said MOS varactor to determine a number of said fingers; and calculating, based on said number of said fingers, a total contact resistance associated with said diffusion regions, said calculating comprising using a formula which accounts for a first amount of current passing through all contacts to an inner diffusion region between two fingers of said gate structure being greater than a second amount of current passing through all contacts to an outer diffusion region adjacent to only one finger of said gate structure.

* * * * *